United States Patent
Isojima et al.

(10) Patent No.: US 10,792,901 B2
(45) Date of Patent: Oct. 6, 2020

(54) OPTICAL FILM AND IMAGE DISPLAY DEVICE

(71) Applicant: DAI NIPPON PRINTING CO., LTD., Tokyo (JP)

(72) Inventors: Seiichi Isojima, Tokyo (JP); Yusuke Hashimoto, Tokyo (JP); Jun Sato, Tokyo (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 0 days.

(21) Appl. No.: 16/329,615

(22) PCT Filed: Aug. 31, 2017

(86) PCT No.: PCT/JP2017/031313
§ 371 (c)(1),
(2) Date: Jun. 27, 2019

(87) PCT Pub. No.: WO2018/043627
PCT Pub. Date: Mar. 8, 2018

(65) Prior Publication Data
US 2019/0315105 A1 Oct. 17, 2019

(30) Foreign Application Priority Data

Sep. 1, 2016 (JP) .................. 2016-171336
Sep. 1, 2016 (JP) .................. 2016-171337

(51) Int. Cl.
*B32B 27/08* (2006.01)
*B32B 27/28* (2006.01)
(Continued)

(52) U.S. Cl.
CPC ............ *B32B 27/281* (2013.01); *B32B 7/022* (2019.01); *B32B 7/023* (2019.01); *B32B 27/08* (2013.01);
(Continued)

(58) Field of Classification Search
CPC .......... B32B 2307/51; B32B 2457/206; B32B 27/00; B32B 27/08; B32B 27/281;
(Continued)

(56) References Cited

U.S. PATENT DOCUMENTS

2009/0246494 A1 10/2009 Matsumoto
2010/0043965 A1 2/2010 Kamiya et al.
(Continued)

FOREIGN PATENT DOCUMENTS

CN 106443842 2/2017
JP 2007-108553 4/2007
(Continued)

OTHER PUBLICATIONS

International Preliminary Report on Patentability, issued in the corresponding PCT Application No. PCT/JP2017/031313, dated Mar. 5, 2019, 7 pages.
(Continued)

*Primary Examiner* — Lawrence D Ferguson
(74) *Attorney, Agent, or Firm* — Hamre, Schumann, Mueller & Larson, P.C.

(57) ABSTRACT

One aspect of the present invention provides a foldable light-transmitting optical film 10 for use in an image display device, comprising a resin base material 11 and a resin layer 12 provided on one surface 11A of the resin base material 11, wherein the shear storage elastic modulus (G') of the optical film 10 at 25° C. in the frequency range from 500 Hz to 1000 Hz inclusive is 1 MPa or more and 200 MPa or less, and the shear loss elastic modulus (G") of the optical film 10 at 25° C. in the frequency range from 500 Hz to 1000 Hz inclusive is 0.1 MPa or more and 100 MPa or less.

14 Claims, 4 Drawing Sheets

(51) Int. Cl.
    *B32B 7/022*     (2019.01)
    *B32B 7/023*     (2019.01)
    *B32B 27/34*     (2006.01)
    *G06F 1/16*     (2006.01)
    *G09F 9/30*     (2006.01)
    *H01L 51/50*     (2006.01)

(52) U.S. Cl.
    CPC ............ B32B 27/34 (2013.01); G06F 1/1652 (2013.01); G09F 9/30 (2013.01); H01L 51/50 (2013.01); *B32B 2307/51* (2013.01); *B32B 2457/206* (2013.01)

(58) Field of Classification Search
    CPC ......... B32B 27/34; B32B 7/022; B32B 7/023; G06F 1/1652; G09F 9/30; H01L 2251/5338; H01L 51/50; H01L 51/5253
    See application file for complete search history.

(56) References Cited

U.S. PATENT DOCUMENTS

| | | | |
|---|---|---|---|
| 2010/0110354 A1 | 5/2010 | Suzuki et al. | |
| 2012/0069443 A1 | 3/2012 | Taguchi et al. | |
| 2014/0210309 A1 | 7/2014 | Miyoshi | |
| 2014/0291648 A1* | 10/2014 | Yamazaki | H01L 51/525 257/40 |
| 2015/0368513 A1 | 12/2015 | Jeong et al. | |
| 2016/0194448 A1 | 7/2016 | Song et al. | |
| 2017/0036242 A1 | 2/2017 | Lee et al. | |
| 2017/0200915 A1 | 7/2017 | Lee et al. | |

FOREIGN PATENT DOCUMENTS

| | | |
|---|---|---|
| JP | 2008-266473 | 11/2008 |
| JP | 2009-186955 | 8/2009 |
| JP | 2009-300506 | 12/2009 |
| JP | 2014-224179 | 12/2014 |
| JP | 2016-014876 | 1/2016 |
| JP | 2016-125063 | 7/2016 |
| JP | 2016-126130 | 7/2016 |
| JP | 2017-126061 | 7/2017 |
| WO | 2007/040159 | 4/2007 |
| WO | 2010/143503 | 12/2010 |
| WO | 2013/047875 | 4/2013 |
| WO | 2014/141866 | 9/2014 |
| WO | 2016/158827 | 10/2016 |

OTHER PUBLICATIONS

International Search Report, issued in the corresponding PCT Application No. PCT/JP2017/031313, dated Nov. 7, 2017, 7 pages.

* cited by examiner

OPTICAL FILM AND IMAGE DISPLAY DEVICE

CROSS-REFERENCE TO RELATED APPLICATION

The present application enjoys the benefit of priority to the prior Japanese Patent Application Nos. 2016-171336 (filed on Sep. 1, 2016) and 2016-171337 (filed on Sep. 1, 2016), the entire disclosures of which are incorporated herein by reference.

TECHNICAL FIELD

The present invention relates to an optical film and image display device.

BACKGROUND ART

Image display devices such as smartphone and tablet terminal have been popular in recent years, and development of foldable image display devices is currently ongoing. Such devices as smartphone and tablet terminal are usually covered with glass. However, if an image display device covered with a cover glass is deliberately folded, the cover glass is highly likely to be cracked in spite of its high hardness. Thus, a study is conducted on the use of an optical film composed of a resin, instead of such a cover glass, in foldable image display devices (see, for example, Japanese Patent Application Publication No. 2016-125063).

SUMMARY OF THE INVENTION

Problems to be Solved by the Invention

In such a foldable image display device, the surface of the optical film may receive an impact and the optical film is thus required to have some impact resistance. In this respect, an impact applied to the surface of the optical film may cause a depression on the surface of the optical film and also a damage to a member (for example, a display panel such as organic light-emitting diode panel) located interior to the optical film in the image display device. Thus, impact resistance is currently required in an optical film to inhibit depression on the film surface and damage to members located interior to the optical film in an image display device when an impact is applied to the surface of the optical film.

However, any current optical film has not had excellent impact resistance enough to inhibit depression on the film surface and damage to members located interior to the optical film in an image display device when an impact is applied to the surface of the optical film.

The present invention is designed to solve the above problems. That is, the object of the present invention is to provide a foldable optical film with excellent impact resistance and an image display device comprising the same foldable optical film.

Means for Solving the Problem

The inventors intensively studied to solve the above-described problem and found that excellent impact resistance is provided to an optical film configured to comprise a resin layer on a resin base material by limiting the shear storage elastic modulus (G') and the shear loss elastic modulus (G") of the optical film to predetermined ranges at 25° C. in the frequency range from 500 Hz to 1000 Hz inclusive. Also, the inventors intensively studied to solve the above-described problem and found that excellent impact resistance and superior hardness are provided to an optical film configured to comprise a hard coat layer on one surface and a resin layer on the other surface of a resin base material by limiting the film thickness of the resin layer to a value of 30 μm or more and less than 200 μm and the shear storage elastic modulus (G') and shear loss elastic modulus (G") of the optical film to predetermined ranges at 25° C. in the frequency range from 500 Hz to 1000 Hz inclusive. The present invention was thereby completed based on those findings.

One aspect of the present invention provides a foldable light-transmitting optical film for use in an image display device, comprising a resin base material and a resin layer provided on one surface of the resin base material, wherein the shear storage elastic modulus (G') of the optical film at 25° C. in the frequency range from 500 Hz to 1000 Hz inclusive is 1 MPa or more and 200 MPa or less, and the shear loss elastic modulus (G") of the optical film at 25° C. in the frequency range from 500 Hz to 1000 Hz inclusive is 0.1 MPa or more and 100 MPa or less.

Another aspect of the present invention provides a foldable light-transmitting optical film for use in an image display device, comprising a resin base material, a hard coat layer provided on one surface of the resin base material, and a resin layer having a film thickness of 30 μm or more and less than 200 μm provided on the other surface of the resin base material, which is opposite to the one surface of the resin base material, wherein the shear storage elastic modulus (G') of the optical film at 25° C. in the frequency range from 500 Hz to 1000 Hz inclusive is 1 MPa or more and 200 MPa or less, and the shear loss elastic modulus (G") of the optical film at 25° C. in the frequency range from 500 Hz to 1000 Hz inclusive is 0.1 MPa or more and 100 MPa or less.

Preferably, no crack or break is formed in the optical film after folding the optical film at an angle of 180 degrees in a manner that leaves a gap of 3 mm between the opposite edges, unfolding the folded optical film, and repeating the process one hundred thousand times.

In the above-described optical film, the resin base material may comprise a polyimide resin, a polyamide resin, or a combination thereof.

Still another aspect of the present invention provides a foldable image display device, comprising a display panel and the above-described optical film placed on the observer's side of the display panel, wherein the resin layer of the optical film is placed on the observer's side of the resin base material.

Yet another aspect of the present invention provides a foldable image display device, comprising a display panel and the above-described optical film placed on the observer's side of the display panel, wherein the hard coat layer of the optical film is placed on the observer's side of the resin base material.

In the above-described image display device, the display panel may be an organic light-emitting diode panel.

Advantageous Effects of the Invention

According to one aspect and another aspect of the present invention, a foldable optical film with excellent impact resistance can be provided. According to still another aspect of the present invention, an image display device comprising such an optical film can be provided.

DETAILED DESCRIPTION OF THE INVENTION

First Embodiment

An optical film and an image display device according to the first embodiment of the present invention are now described below with reference to the drawings. In this specification, the terms "film" and "sheet" are not distinguished from each other on the basis of the difference of names alone. For example, the term "film" is thus used to refer inclusively to a member called "sheet." FIG. 1 depicts a schematic diagram of the optical film according to the present embodiment, and FIGS. 2(A) to 2(C) schematically illustrate each step of the foldability test.

<<Optical Film>>

Figure 1:
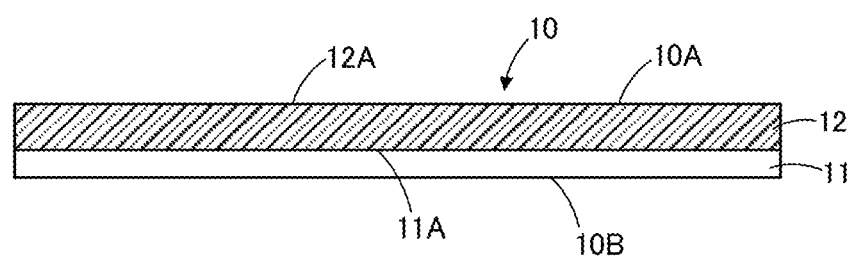
FIG. 1 depicts the schematic diagram of an optical film according to the first embodiment.
Figure 2A:
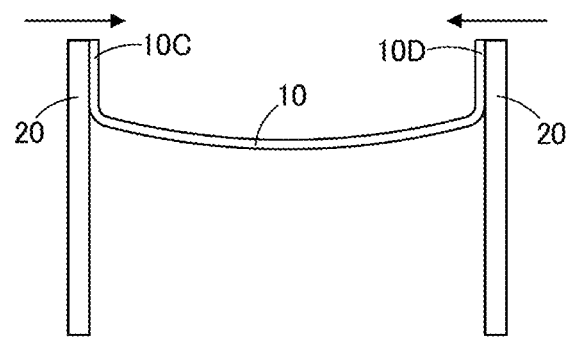
FIGS. 2(A) to 2(C) schematically illustrate each step of the foldability test.
Figure 2B:
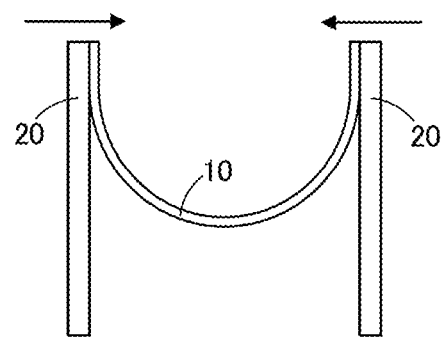
Figure 2C:
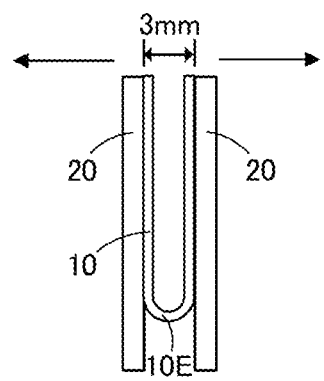

An optical film 10 shown in FIG. 1 is used in an image display device and is foldable and light transmissive. The term "light-transmitting" as used herein refers to a property that allows light transmission, including, for example, a total light transmittance of 50% or more, preferably 70% or more, more preferably 80% or more, and particularly preferably 90% or more. The term "light-transmitting" does not necessarily refer to transparency and may refer to translucency.

The optical film 10 comprises a resin base material 11 and a resin layer 12 provided on one surface 11A of the resin base material 11. In FIG. 1, the surface 10A of the optical film 10 corresponds to the surface 12A of the resin layer 12. In this specification, the surface of the optical film is used to refer to one surface of the optical film. Thus, the surface opposite to the surface of the optical film will be referred to as the back surface, distinguished from the surface of the optical film. The back surface 10B of the optical film 10 corresponds to the surface opposite to the one surface 11A of the resin base material 11.

In the optical film 10, the shear storage elastic modulus (G') at 25° C. in the frequency range from 500 Hz to 1000 Hz inclusive is 1 MPa or more and 200 MPa or less. In cases where the shear storage elastic modulus (G') of the optical film is less than 1 MPa, the surface of the optical film is likely to be largely deformed by an impact applied to the film surface and the optical film is also likely to reduce the hardness. Additionally, in cases where the shear storage elastic modulus (G') of the optical film is more than 200 MPa, the optical film is likely to be cracked when folded. The lower limit of shear storage elastic modulus (G') in the optical film 10 is preferably 10 MPa or more, while the upper limit of shear storage elastic modulus (G') in the optical film 10 is preferably 100 MPa or less.

In the optical film 10, the shear loss elastic modulus (G") at 25° C. in the frequency range from 500 Hz to 1000 Hz inclusive is 0.1 MPa or more and 100 MPa or less. In cases where the shear loss elastic modulus (G") of the optical film is less than 0.1 MPa, the impact-absorbing capacity of the optical film is likely to be reduced. Additionally, in cases where the shear loss elastic modulus (G") of the optical film is more than 100 MPa, the surface of the optical film is likely to have some tackiness. The lower limit of shear loss elastic modulus (G") in the optical film 10 is preferably 0.5 MPa or more, while the upper limit of shear loss elastic modulus (G") in the optical film 10 is preferably 50 MPa or less.

The shear storage elastic modulus (G') and shear loss elastic modulus (G") can be measured with a dynamic viscoelasticity measuring device (DMA). When the shear storage elastic modulus (G') and shear loss elastic modulus (G") of the optical film 10 are measured with a dynamic viscoelasticity measuring device (DMA), rectangular pieces of 10 mm×5 mm are first stamped out from the optical film 10 to obtain samples. Each of the two samples is mounted to a measuring tool for a dynamic viscoelasticity measuring device (product name "Rheogel-E4000"; manufactured by UBM Corporation). Specifically, the measuring tool comprises three plates (one inner metal plate with a thickness of 1 mm and two outer metal plates sandwiching the inner plate) arranged in the horizontal direction. One of the samples is held between the inner plate and one outer plate, while the other sample is held between the inner plate and the other outer plate. In this case, each sample is clamped by the inner plate attached to the resin layer and the outer plate attached to the base material. The samples in the measuring tool with distance between chucks of 20 mm are set in the dynamic viscoelasticity measuring device (product name "Rheogel-E4000"; manufactured by UBM Corporation) and heated at a temperature rising rate of 2° C./min to a predetermined temperature of 25° C. Under this condition, a vertical oscillation with a strain amount of 1% and with a frequency ranging from 500 Hz to 1000 Hz is applied to the two outer plates with keeping the inner plate fixed to perform the dynamic viscoelasticity measurement of solid material at 25° C., whereby the shear storage elastic modulus (G') and shear loss elastic modulus (G") of the optical film 10 are measured. The shear storage elastic modulus (G') and shear loss elastic modulus (G") of the optical film in the frequency range from 500 Hz to 1000 Hz inclusive here are calculated by applying the vertical oscillation with frequencies of 500, 750, and 950 Hz to the outer plates to measure the shear storage elastic modulus (G') and shear loss elastic modulus (G") of the optical film at the respective frequencies; calculating the arithmetic means of these measured shear storage elastic modulus (G') and shear loss elastic modulus (G"); and repeating the same measurement three times and further arithmetically averaging the arithmetic means obtained from the three experiments. As seen above, the frequency range from 500 Hz to 1000 Hz inclusive is selected because the frequencies within the frequency range correspond to frequencies at which a free-falling object from a height of several centimeters produces a depression of several to tens micrometers on the surface of the optical film and damages a member, such as a display panel, located interior to the optical film in an image display device.

The optical film 10 is foldable. Specifically, no crack or break is formed in the optical film 10 even in cases where the below-described foldability test is repeated on the optical film preferably one hundred thousand times, more preferably two hundred thousand times, and further preferably one million times. In cases where the foldability test is repeated on the optical film 10 one hundred thousand times and the optical film 10 is, for example, cracked, the optical film 10 shows low foldability. The foldability test may be carried out by folding the optical film 10 with the resin layer 12 facing either inward or outward. In either case, no crack or break is preferably formed in the optical film.

The foldability test is carried out as follows. The foldability test starts with fixing the edge 10C and opposite edge 10D of the optical film 10 to fixing members 20 arranged in parallel to each other, as shown in FIG. 2(A). The optical film 10 may be in any shape, and the optical film 10 used for the foldability test preferably has a rectangular shape (for example, a rectangle of 30 mm×100 mm). In addition, the fixing members 20 can slide in the horizontal direction, as shown in FIG. 2(A).

Next, the fixing members 20 are moved close to each other to fold and deform the optical film 10, as shown in FIG. 2 (B); the fixing members 20 are further moved until a gap of 3 mm is left between the two opposing edges of the optical film 10 fixed to the fixing members 20, as shown in FIG. 2 (C); subsequently, the fixing members 20 are moved in opposite directions to resolve the deformation of the optical film 10.

As shown FIG. 2(A) to (C), the fixing members 20 can be moved to fold the optical film 10 at an angle of 180 degrees. In addition, a gap of 3 mm can be maintained between the two opposing edges of the optical film 10 by carrying out the foldability test in a manner that prevents the bent part 10E of the optical film 10 from being forced out beyond the lower edges of the fixing members 20 and controls the fixing members 20 to keep a distance of 3 mm when they approach closest each other. In this case, the outer diameter of the bent part 10E is considered as 3 mm. The thickness of the optical film 10 is small enough as compared with the gap between the fixing members 20 (3 mm). Thus, it seems unlikely that a difference in the thickness of the optical film 10 affects the result of the foldability test on the optical film 10.

The surface 10A of the optical film 10 (the surface 12A of the resin layer 12) preferably has a hardness (pencil hardness) of 3H or harder, more preferably 5H, and further preferably 6H or harder when measured by the pencil hardness test specified by JIS K5600-5-4: 1999. The pencil hardness test will be performed by applying a load of 1 kg to a pencil and moving the pencil at a speed of 1 mm/sec. The grade of the hardest pencil that does not scratch the surface of the optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of the optical film with a pencil with specific hardness in four or more out of the five replicates, the pencil with the hardness is determined to make no scratch on the surface of the optical film. The above-described scratch refers to a scratch which is visibly detectable when the surface of an optical film subjected to the pencil hardness test is observed under transmitting fluorescent light.

The optical film 10 preferably has a yellow index (YI) of 15 or less. In cases where the optical film 10 has a YI of more than 15, the optical film is so yellow that the optical film is unlikely to be applicable to uses that require the optical film to be transparent. The yellow index (YI) is obtained by measuring a cut piece of the optical film with a size of 5 cm×10 cm using a spectrophotometer (product name "UV-3100PC", manufactured by Shimadzu Corporation; light source: tungsten lamp and deuterium lamp), processing the obtained values according to the formula described in JIS Z8722: 2009 to calculate color tristimulus values X, Y, and Z, and processing the obtained tristimulus values X, Y, and Z according to a formula described in ASTM D1925: 1962 to calculate a yellow index. The upper limit of yellow index (YI) in the optical film 10 is more preferably 10 or less.

The yellow index (YI) of the optical film 10 may be adjusted, for example, by adding a coloring substance of blue color, the complementary color to yellow, to the resin base material 11 or the resin layer 12. Even if use of a polyimide base material as the resin base material results in a yellow color problem, the yellow index (YI) of the optical film 10 can be decreased by adding a blue coloring substance to the resin base material 11 or the resin layer 12.

The above-described blue coloring substance may be either a pigment or a dye, and preferably has both light and heat resistance in cases where, for example, the optical film 10 is used in an organic light-emitting diode display device. As the above-described blue coloring substance, an organic pigment such as a polycyclic or metal complex organic pigment is less prone to molecular breakage by ultraviolet light, in contrast to the tendency to form a molecular dispersion of the pigment itself, and has a further excellent light resistance, and is thus suitable for uses that require an optical film to be, for example, light resistant. More specifically, phthalocyanine organic pigments are suitable. However, pigment particles are dispersed in a solvent and the scattered particles cause loss of transparency. Thus, the size of dispersed pigment particles is preferably in the Rayleigh scattering region. On the other hand, in cases where the transparency of an optical film is critical, a pigment which is well dispersed in a solvent is preferably used as the above-described blue coloring substance.

The optical film 10 preferably has a light transmittance of 8% or less at a wavelength of 380 nm. In cases where the above-described transmittance of the optical film is more than 8% and such an optical film is used in a mobile terminal, a polarizer inside the mobile terminal may be easily degraded by exposure to ultraviolet light. The above-described transmittance can be measured using a spectrophotometer (product name "UV-3100PC", manufactured by Shimadzu Corporation; light source: tungsten lamp and deuterium lamp). The arithmetic mean of three measurements is determined as the above transmittance. The maximum light transmittance of the optical film 10 is more preferably 5%. The above-described transmittance of the optical film 10 can be achieved by adjusting the amount of the below-described ultraviolet absorber added to the resin layer 12.

The optical film 10 preferably has a haze value (total haze value) of 2.5% or less. In cases where the above-described haze value of the optical film is more than 2.5% and such an optical film is used in a mobile terminal, the image display screen of the mobile terminal may turn white in color. The above-described haze value can be measured using a haze meter (product name "HM-150"; manufactured by Murakami Color Research Laboratory Co., Ltd.) in accordance with JIS K7136: 2000. The above-described haze value is the arithmetic mean of three measurements obtained by measuring a cut piece of the optical film with a size of 5 cm×10 cm. The above-described haze value is more preferably 1.5% or less, still more preferably 1.0% or less. The above-described haze value of the optical film 10 can be achieved by adjusting the amount of the below-described ultraviolet absorber added to the resin layer 12.

Light emitting diodes are actively employed in recent years as the backlight source for image display devices such as personal computers and tablet terminals and such light emitting diodes strongly emit light called blue light. The blue light has a wavelength of 380 to 495 nm and other properties similar to those of ultraviolet light, and the energy of the blue light is so high that the blue light not absorbed by the cornea and the crystalline lens and passing into the retina is considered as a cause of retinal damage, eye strain, sleep disorder, and the like. Thus, an optical film used in an image display device is preferred to have no influence on the color representation on a display screen and to have an excellent blue light blocking property. Therefore, the optical film 10 is preferred to have a spectral transmittance of less than 1% at a wavelength of 380 nm, a spectral transmittance of less than 10% at a wavelength of 410 nm, and a spectral transmittance of 70% or more at a wavelength of 440 nm in view of blue light blocking effect because the above-described optical film having a spectral transmittance of 1% or more at a wavelength of 380 nm or a spectral transmittance of 10% or more at a wavelength of 410 nm may not solve blue light problems and the optical film having a spectral transmittance of less than 70% at a wavelength of 440 nm may give some effects on the color representation on the display screen of an image display device in which the optical film is used. In the blue light wavelength range, the optical film 10 can sufficiently absorb light with wavelengths equal to and under 410 nm and sufficiently pass light with wavelengths equal to and above 440 nm, and can exhibit excellent blue light blocking performance without affecting the color representation on a display screen. Additionally, use of the optical film 10 with such an excellent blue light blocking property in an organic light-emitting diode (OLED) display device as an image display device effectively inhibits degradation of the organic light-emitting diode device.

Preferably, the optical film 10 has a transmittance of nearly 0% for light with a wavelength of up to 380 nm, gradually increases the light transmittance above a wavelength of 410 nm, and exhibits a sharp increase of light transmittance around a wavelength 440 nm. Specifically, the spectral transmittance of the optical film preferably varies sigmoidally with the wavelength, for example, from 410 nm to 440 nm. The above-described optical film more preferably has a spectral transmittance of less than 0.5%, further preferably less than 0.2%, at a wavelength of 380 nm; a spectral transmittance of less than 7%, further preferably less than 5%, at a wavelength of 410 nm; and a spectral transmittance of 75% or more, further preferably 80% or more, at a wavelength of 440 nm. The optical film 10 preferably has a spectral transmittance of less than 50% at a wavelength 420 nm. The optical film 10 fulfilling such requirements with respect to spectral transmittance exhibits a sharp increase of transmittance around a wavelength of 440 nm and can obtain an excellent blue light-blocking property without affecting the color representation on a display screen.

The optical film 10 more preferably has a spectral transmittance of less than 0.1% at a wavelength of 380 nm, a spectral transmittance of less than 7% at a wavelength of 410 nm, and a spectral transmittance of 80% or more at a wavelength of 440 nm.

The slope as a function of wavelength obtained by the least square method applied to the transmittance of the optical film 10 is preferably more than 2.0 in a spectrum range from 415 to 435 nm. In cases where the above-described slope is 2.0 or less, the optical film fails to cut a sufficient amount of light in the blue light wavelength range, such as a wavelength range from 415 to 435 nm, and may exhibit an attenuated blue light-cutting function. Also, the optical film may cut an excess amount of light in the blue light wavelength range (wavelengths from 415 to 435 nm) and, in that case, interferes with the backlight or the light in a wavelength range emitted from an image display device (for example, light with wavelengths equal to and above 430 nm emitted from an OLED) and be highly likely to cause a problem such as poor color representation. The above-described slope can be calculated, for example, by measuring at least five points spaced 1 nm apart to obtain the transmittance in a range from 415 to 435 nm using a spectrophotometer with the ability to permit measurement to 0.5% accuracy (product name "UV-3100PC", manufactured by Shimadzu Corporation).

The optical film 10 preferably has a blue light blocking rate of 40% or more. In cases where the blue light blocking rate is less than 40%, the above-described blue light problems may not be sufficiently resolved. The above-described blue light blocking rate is calculated according to, for example, JIS T7333: 2005. Such a blue light blocking rate can be effected, for example, by adding the below-described sesamol-type benzotriazole monomer to the resin layer 12.

The optical film 10 can be cut into a desired size or may be rolled. In cases where the optical film 10 is cut into a desired size, the optical film is not limited to a particular size, and the size of the film is appropriately determined depending on the display size of an image display device such as, for example, smartphone, tablet terminal, personal computer (PC), wearable terminal, digital signage, or television. Specifically, the optical film 10 may be, for example, not less than 1 inch and not more than 500 inch in size.

The optical film 10 installed in an image display device may be located inside the image display device, and is preferably on the surface of the image display device. In cases of being located on the surface of an image display device, the optical film 10 serves as a cover film, which is used instead of a cover glass.

<<Resin Base Material>>

The resin base material 11 is a base material composed of a light-transmitting resin. The thickness of the resin base material 11 is preferably 10 μm or more and 100 μm or less. In cases where the thickness of the resin base material is less than 10 μm, the resulting optical film is tightly rolled and also has such insufficient hardness that the pencil hardness is unlikely to be 3H or harder. Furthermore, such an optical film produced by roll-to-roll process is prone to forming wrinkles and is likely to deteriorate the appearance. On the other hand, in cases where the thickness of the resin base material is more than 100 μm, the resulting optical film may not satisfy the conditions required by the below-described foldability test due to poor foldability, and the optical film also has such a high unit weight that the optical film is undesirable in terms of weight saving. A cross-section of the resin base material 11 is photographed using a scanning electron microscope (SEM) and the film thickness of the resin base material 11 is measured at 10 different locations within the image of the cross-section, and the arithmetic mean of the 10 film thickness values is determined as the thickness of the resin base material 11. The lower limit of the resin base material 11 is more preferably 25 μm or more in thickness, while the upper limit of the resin base material 11 is more preferably 80 μm or less in thickness.

Examples of the resin that composes the resin base material 11 include polyimide resins, polyamide-imide resins, polyamide resins, polyester resins (for example, polyethylene terephthalate and polyethylene naphthalate). Among those resins, polyimide resins, polyamide resins, and combinations thereof are preferred in terms of several criteria: the resulting optical film has excellent hardness and transparency as well as is less broken or fractured during the foldability test, and also has such an outstanding heat resistance that the optical film can obtain further excellent hardness and transparency by film baking.

A polyimide resin can be obtained from the reaction between a tetracarboxylic component and a diamine component. Preferably, a tetracarboxylic component and a diamine component are polymerized to form a polyamic acid, which is then imidized. The imidization may be heat imidization or chemical imidization. Additionally, a polyimide resin can also be produced by a combinational method of heat imidization and chemical imidization. The polyimide resin may be an aliphatic polyimide resin, and is preferably an aromatic ring-containing polyimide resin. The aromatic ring-containing polyimide resin is composed of a tetracarboxylic component and a diamine component, at least one of which is an aromatic ring-containing component.

As specific examples of the tetracarboxylic component, tetracarboxylic dianhydrides are suitable, including cyclohexane tetracarboxylic dianhydride, cyclopentane tetracarboxylic dianhydride, dicyclohexane-3,4,3',4'-tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 4,4'-(hexafluoroisopropylidene)diphthalic anhydride, 3,4'-(hexafluoroisopropylidene)diphthalic anhydride, 3,3'-(hexafluoroisopropylidene)diphthalic anhydride, 2,3,6,7-naphthalene tetracarboxylic dianhydride, 1,4,5,8-naphthalene tetracarboxylic dianhydride, 1,2,5,6-naphthalene tetracarboxylic dianhydride, 1,2,3,4-benzene tetracarboxylic dianhydride, 3,4,9,10-perylene tetracarboxylic dianhydride, 2,3,6,7-anthracene tetracarboxylic dianhydride, and 1,2,7,8-phenanthrene tetracarboxylic dianhydride. These may be used individually or in combination of two or more.

Specific examples of an available diamine component include p-phenylenediamine, m-phenylenediamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 4,4'-diaminobenzanilide, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, N,N'-bis(4-aminophenyl)terephthalamide, 9,9-bis(4-aminophenyl)fluorene, 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, 3,3'-dimethyl-4,4'-diaminobiphenyl, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, 4,4'-bis[4-(4-aminophenoxy)phenoxy]diphenyl sulfone, 3,3'-diamino-4,4'-diphenoxy benzophenone, 3,3'-diamino-4,4'-dibiphenoxy benzophenone, 3,3'-diamino-4-phenoxy benzophenone, 3,3'-diamino-4-biphenoxy benzophenone, 6,6'-bis(3-aminophenoxy)-3,3,3',3'-tetramethyl-1,1'-spirobiindane, 6,6'-bis(4-aminophenoxy)-3,3,3',3'-tetramethyl-1,1'-spirobiindane, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis(2-aminomethoxy)ethyl]ether, bis[2-(2-aminoethoxy)ethyl]ether, bis[2-(3-aminoprotoxy)ethyl]ether, trans-cyclohexanediamine, trans-1,4-bismethylene cyclohexanediamine, 2,6-bis(aminomethyl)bicyclo[2,2,1]heptane, 2,5-bis(aminomethyl)bicyclo[2,2,1]heptane, and diamines resulting from substitution of some or all hydrogen atoms in an aromatic ring of each of the above-described aromatic ring-containing diamines with a substituent(s) selected from fluoro, methyl, methoxy, trifluoromethyl, and trifluoromethoxy groups. These may be used individually or in combination of two or more.

For improving the light transmittance and the rigidity, the polyimide resin preferably contains an aromatic ring and at least one selected from the group consisting of: (i) a fluorine atom, (ii) an aliphatic ring, and (iii) a linking group that interrupts the electron conjugation between donor and acceptor aromatic rings. In a polyimide resin, the presence of an aromatic ring enhances the orientation of the polyimide resin itself and increases the rigidity but tends to decrease the transmittance depending on the absorption wavelength of the aromatic ring. In cases where the polyimide resin contains (i) a fluorine atom, the fluorine atom can give the polyimide backbone an electron configuration to inhibit electron transfer, and consequently improves the light transmittance. Also, in cases where the polyimide resin contains (ii) an aliphatic ring, the aliphatic ring can interrupt the pi-electron conjugation within the polyimide backbone to inhibit electron transfer within the backbone, and consequently improves the light transmittance. Furthermore, in cases where the polyimide resin contains (iii) a linking group that interrupts the electron conjugation between donor and acceptor aromatic rings, the linking group can interrupt the pi-electron conjugation within the polyimide backbone to inhibit electron transfer within the backbone, and consequently improves the light transmittance. Examples of such a linking group that interrupts the electron conjugation between donor and acceptor aromatic rings include ether linkage, thioether linkage, carbonyl linkage, thiocarbonyl linkage, amide linkage, sulfonyl linkage, and, sulfinyl linkage, as well as divalent linking groups such as alkylene groups optionally substituted by fluorine.

Among those polyimide resins, a polyimide resin containing an aromatic ring and a fluorine atom is preferably used in terms of improving the light transmittance and the rigidity. In the fluorine atom-containing polyimide resin, the ratio of fluorine atom number (F) to carbon atom number (C), F/C, is preferably 0.01 or more, further preferably 0.05 or more, when those atom numbers are determined by analyzing the surface of the polyimide resin by X-ray photoelectron spectroscopy. On the other hand, an excessively high content of fluorine atom is likely to result in reduction of, for example, the heat resistance inherent to the polyimide resin, and the ratio of fluorine atom number (F) to carbon atom number (C), F/C, is thus preferably 1 or less, further preferably 0.8 or less. In this respect, the above-described ratio obtained by X-ray photoelectron spectroscopy (XPS) can be calculated from the atom percentages of the respective atoms measured using an X-ray photoelectron spectrometer (for example, Theta Probe, Thermo Scientific Inc.).

Additionally, a polyimide resin in which 70% or more of the hydrogen atoms bound to the carbon atoms are directly bound to the aromatic rings is preferably used in terms of improving the light transmittance and the rigidity. In the polyimide resin, the ratio of the (number of) hydrogen atoms directly bound to the aromatic rings to the total (number of) hydrogen atoms bound to the carbon atoms is further preferably 80% or more, more preferably 85% or more. A polyimide in which 70% or more of the hydrogen atoms bound to the carbon atoms are directly bound to the aromatic rings is preferred because optical properties, particularly total light transmittance and yellow index (YI), vary less in the resulting optical film even after a heating process in the atmosphere, such as a stretching process at a temperature of 200° C. or higher. A polyimide resin in which 70% or more of the hydrogen atoms bound to the carbon atoms are directly bound to the aromatic rings has a low reactivity with oxygen, from which the chemical structure of the polyimide resin is predicted to hardly change. A base material composed of a polyimide resin is often used in devices that require taking advantage of the high heat resistance of the polyimide resin for a processing process involving a heating process in the production of the devices. A polyimide resin in which 70% or more of the hydrogen atoms bound to the carbon atoms are directly bound to the aromatic rings does not need the later stage processes performed in inert atmosphere to maintain the transparency of the resulting optical film, and can advantageously save costs for equipment and for maintenance of the atmosphere. In this respect, the ratio of the (number of) hydrogen atoms directly bound to the aromatic rings to the total (number of) hydrogen atoms bound to the carbon atoms in a polyimide resin can be determined by analyzing degradation products of the polyimide using high-performance liquid chromatography, a gas chromatograph mass spectrometer, and NMR. For example, a sample is degraded with an aqueous alkaline solution or supercritical methanol and the obtained degradation products are separated by high-performance liquid chromatography. Each separated peak is qualitatively analyzed using a gas chromatograph mass spectrometer, NMR, and the like, while quantitatively analyzed using high-performance liquid chromatography, whereby the ratio of the (number of) hydrogen atoms directly bound to the aromatic rings to the total (number of) hydrogen atoms bound to the carbon atoms in the polyimide can be determined.

Additionally, the polyimide resin preferably has at least one structure selected from the group consisting of the structures represented by the general formula (1) below and the general formula (3) below, among others, in terms of improving the light transmittance and the rigidity.

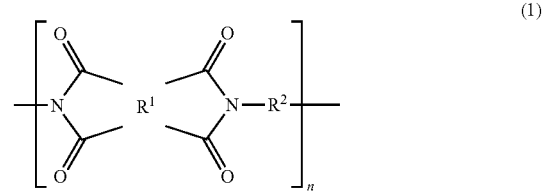

(1)

In the above-described general formula (1), $R^1$ represents a tetracarboxylic acid residue as a tetravalent group; $R^2$ represents at least one divalent group selected from the group consisting of trans-cyclohexanediamine residue, trans-1,4-bismethylene cyclohexanediamine residue, 4,4'-diaminodiphenyl sulfone residue, 3,4'-diaminodiphenyl sulfone residue, and divalent groups represented by the general formula (2) below; n represents the number of repeating units, which is 1 or more. In this specification, the "tetracarboxylic acid residue" refers to a residue remaining after subtracting four carboxylic groups from a tetracarboxylic acid, and represents the same structure as a residue remaining after subtracting the acid dianhydride structure from a tetracarboxylic dianhydride. Additionally, the "diamine residue" refers to a residue remaining after subtracting two amino groups from a diamine.

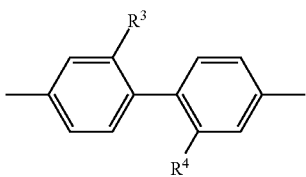
(2)

In the above-described general formula (2), $R^3$ and $R^4$ each independently represent a hydrogen atom, alkyl group, or perfluoroalkyl group.

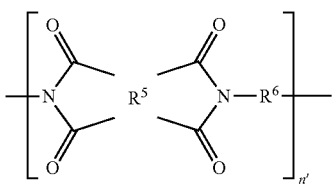
(3)

In the above-described general formula (3), $R^5$ represents at least one tetravalent group selected from the group consisting of cyclohexane tetracarboxylic acid residue, cyclopentane tetracarboxylic acid residue, a dicyclohexane-3,4,3',4'-tetracarboxylic acid residue, and a 4,4'-(hexafluoroisopropylidene)diphthalic acid residue; $R^6$ represents a diamine residue as a divalent group; n' represents the number of repeating units, which is 1 or more.

In the above-described general formula (1), $R^1$ refers to a tetracarboxylic acid residue and can represent, as indicated above, a residue remaining after subtracting the acid dianhydride structure from a tetracarboxylic dianhydride. As $R^1$ in the above-described general formula (1), at least one selected from the group consisting of 4,4'-(hexafluoroisopropylidene)diphthalic acid residue, 3,3',4,4'-biphenyl tetracarboxylic acid residue, pyromellitic residue, 2,3',3,4'-biphenyl tetracarboxylic acid residue, 3,3',4,4'-benzophenone tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue is preferably contained, among others, in terms of improving the light transmittance and the rigidity. At least one selected from the group consisting of 4,4'-(hexafluoroisopropylidene)diphthalic acid residue, 4,4'-oxydiphthalic acid residue, and 3,3',4,4'-diphenylsulfone tetracarboxylic acid residue is further preferably contained.

As $R^1$, those suitable residues are contained in total preferably at a content of 50% by mole or more, further preferably 70% by mole or more, and still further preferably 90% by mole or more.

Additionally, a combination of at least one selected from a group of tetracarboxylic acid residues suitable for improving the rigidity (group A), such as the group consisting of 3,3',4,4'-biphenyl tetracarboxylic acid residue, 3,3',4,4'-benzophenone tetracarboxylic acid residue, and pyromellitic residue, and at least one selected from a group of tetracarboxylic acid residues suitable for improving the transparency (group B), such as the group consisting of 4,4'-(hexafluoroisopropylidene)diphthalic acid residue, 2,3',3,4'-biphenyl tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue, is preferably used as $R^1$.

For the content ratio of the group of tetracarboxylic acid residues suitable for improving the rigidity (group A) to the group of tetracarboxylic acid residues suitable for improving the transparency (group B) in that case, preferably 0.05 moles or more and 9 moles or less, further preferably 0.1 moles or more and 5 moles or less, still further preferably 0.3 moles or more and 4 moles or less, of the group of tetracarboxylic acid residues suitable for improving the rigidity (group A) are combined with 1 mole of the group of tetracarboxylic acid residues suitable for improving the transparency (group B).

In the above-described general formula (1), $R^2$ preferably represents at least one divalent group selected from the group consisting of 4,4'-diaminodiphenyl sulfone residue, 3,4'-diaminodiphenyl sulfone residue, and divalent groups represented by the above-described general formula (2), further preferably at least one divalent group selected from the group consisting of 4,4'-diaminodiphenyl sulfone residue, 3,4'-diaminodiphenyl sulfone residue, and divalent groups represented by the above-described general formula (2) where $R^3$ and $R^4$ each represent a perfluoroalkyl group, among others, in terms of improving the light transmittance and the rigidity.

As $R^5$ in the above-described general formula (3), 4,4'-(hexafluoroisopropylidene)diphthalic acid residue, 3,3',4,4'-diphenylsulfone tetracarboxylic acid residue, and oxydiphthalic acid residue are preferably contained, among others, in terms of improving the light transmittance and the rigidity.

As $R^5$, those suitable residues are contained preferably at a content of 50% by mole or more, further preferably 70% by mole or more, and still further preferably 90% by mole or more.

In the above-described general formula (3), $R^6$ refers to a diamine residue and can represent, as indicated above, a residue remaining after subtracting two amino groups from a diamine. As $R^6$ in the above-described general formula (3), preferably at least one divalent group selected from the group consisting of 2,2'-bis(trifluoromethyl)benzidine residue, bis[4-(4-aminophenoxy)phenyl]sulfone residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl]hexafluoropropane residue, 4,4'-diamino-2-(trifluoromethyl)diphenyl ether residue, 4,4'-diaminobenzanilide residue, N,N'-bis(4-aminophenyl)terephthalamide residue, and 9,9-bis(4-aminophenyl)fluorene residue, further preferably at least one divalent group selected from the group consisting of 2,2'-bis(trifluoromethyl)benzidine residue, bis[4-(4-aminophenoxy)phenyl]sulfone residue, and 4,4'-diaminodiphenyl sulfone residue, is contained, among others, in terms of improving the light transmittance and the rigidity.

As $R^6$, those suitable residues are contained in total preferably at a content of 50% by mole or more, further preferably 70% by mole or more, and still further preferably 90% by mole or more.

Additionally, a combination of at least one selected from a group of diamine residues suitable for improving the rigidity (group C), such as the group consisting of bis[4-(4-aminophenoxy)phenyl]sulfone residue, 4,4'-diaminobenzanilide residue, N,N'-bis(4-aminophenyl)terephthalamide residue, paraphenylenediamine residue, methaphenylenediamine residue, and 4,4'-diaminodiphenylmethane residue, and at least one selected from a group of diamine residues suitable for improving the transparency (group D), such as the group consisting of 2,2'-bis(trifluoromethyl)benzidine residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl]hexafluoropropane residue, 4,4'-diamino-2-(trifluoromethyl)diphenyl ether residue, and 9,9-bis(4-aminophenyl)fluorene residue, is preferably used as $R^6$.

For the content ratio of the group of diamine residues suitable for improving the rigidity (group C) to the group of diamine residues suitable for improving the transparency (group D) in that case, preferably 0.05 moles or more and 9 moles or less, further preferably 0.1 moles or more and 5 moles or less, more preferably 0.3 moles or more and 4 moles or less, of the group of diamine residues suitable for improving the rigidity (group C) are combined with 1 mole of the group of diamine residues suitable for improving the transparency (group D).

For the structures represented by the above-described general formulae (1) and (3), n and n' each independently represent the number of repeating units, which is 1 or more. The number of repeating units, n, in the polyimide may be appropriately selected depending on the structure to allow the polyimide to have a preferred glass transition temperature as described below, and is not limited to a particular number. The average number of repeating units is typically 10 to 2,000, further preferably 15 to 1,000.

Additionally, the polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid.

The polyimide resin preferably has a glass transition temperature of 250° C. or higher, further preferably 270° C. or higher, in terms of heat resistance, while the polyimide resin preferably has a glass transition temperature of 400° C. or lower, further preferably 380° C. or lower, in terms of ease of stretching and of reducing the baking temperature.

Specific examples of the polyimide resin include compounds having the structure represented by the formula below. In the formula below, n represents the number of repeating units, which is an integer of 2 or more.

(4)

(5)

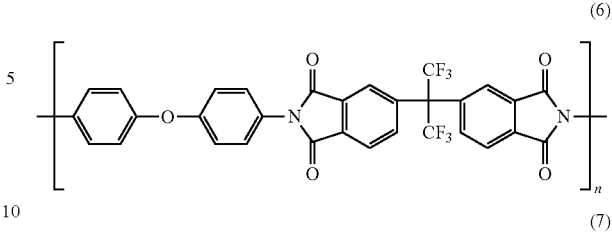

(6)

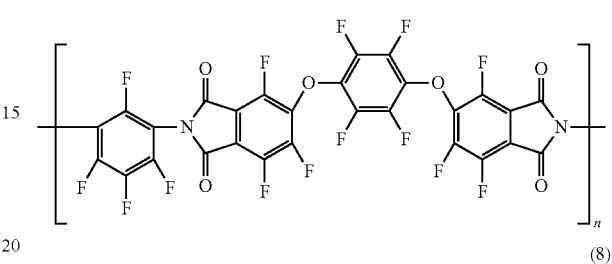

(7)

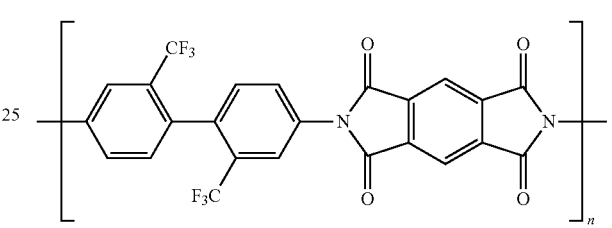

(8)

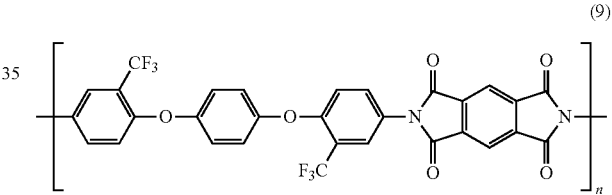

(9)

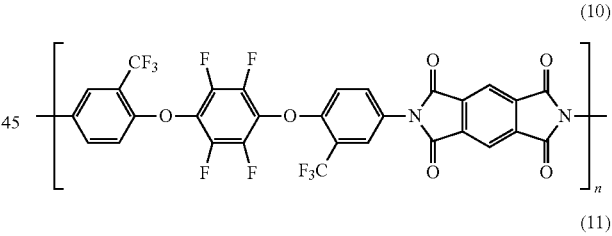

(10)

(11)

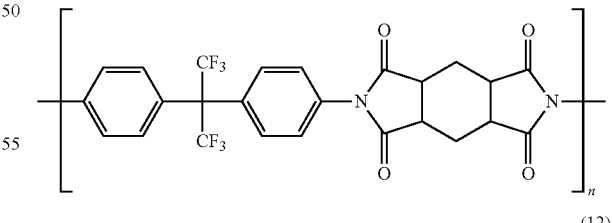

(12)

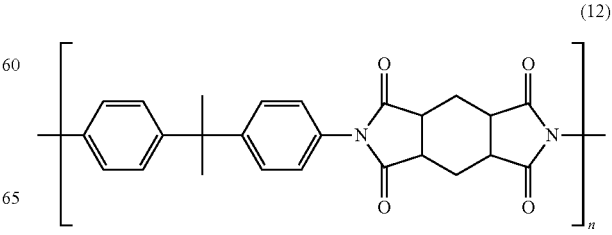

(13)
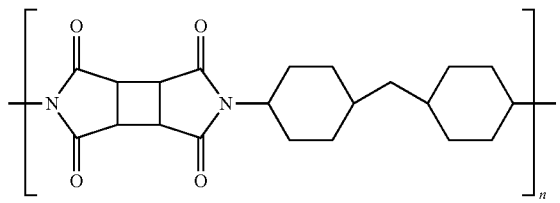

(14)
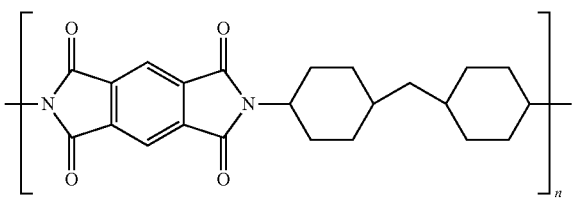

(15)
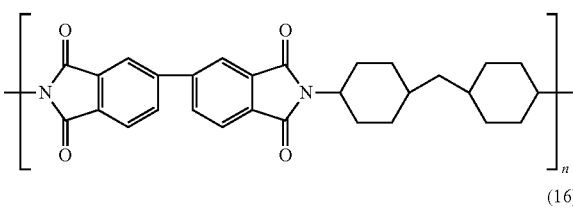

(16)
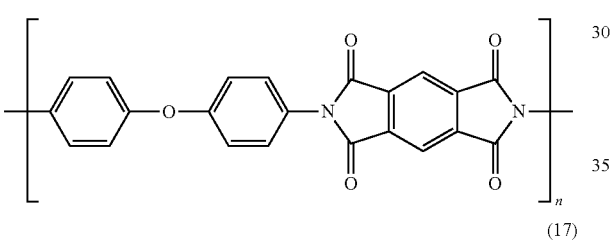

(17)
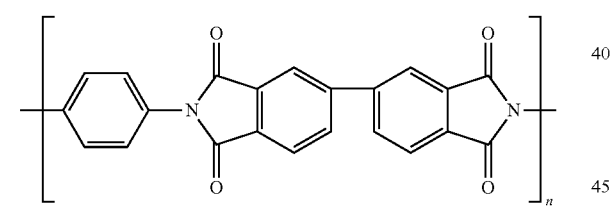

(18)
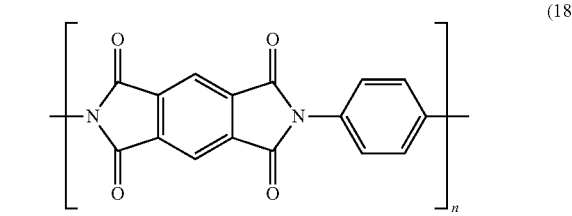

(19)
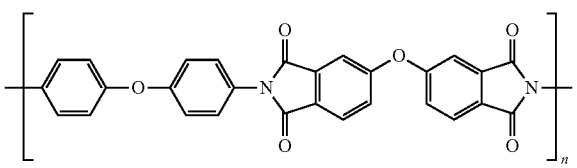

(20)
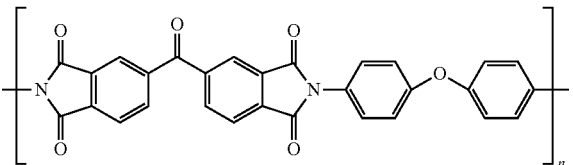

The concept of polyamide resin includes aromatic polyamides (aramids) as well as aliphatic polyamides. The polyamide resin generally refers to a resin having the backbone represented by the formula (21) or (22) below, and examples of the above-described polyamide resin include a compound represented by the formula (23) below. In the formula below, n represents the number of repeating units, which is an integer of 2 or more.

(21)

$$\left[ \text{N} \!-\! \text{C}_6\text{H}_4 \!-\! \text{N} \!-\! \text{C} \!-\! \text{C}_6\text{H}_4 \!-\! \text{C} \right]_n$$

(22)

(23)

A commercially available base material may be used as a base material composed of the polyimide or polyamide resin represented by any of the above-described formulae (4) to (20) and (23). Examples of a commercially available base material composed of the above-described polyimide resin include Neopulim and the like manufactured by Mitsubishi Gas Chemical Company, Inc., while examples of a commercially available base material composed of the above-described polyamide resin include Mictron and the like manufactured by Toray Industries, Inc.

Additionally, a base material synthesized by a known method may be used as a base material composed of the polyimide or polyamide resin represented by any of the above-described formulae (4) to (20) and (23). For example, the polyimide resin represented by the above-described formula (4) is synthesized by a method described Japanese Patent Application Publication No. 2009-132091 and can be obtained, specifically, by a reaction of 4,4'-hexafluoropropylidenebisphthalic dianhydride (FPA) and 2,2'-bis(trifluoromethyl)-4,4'-diaminobiphenyl (TFDB), as represented by the formula (24) below.

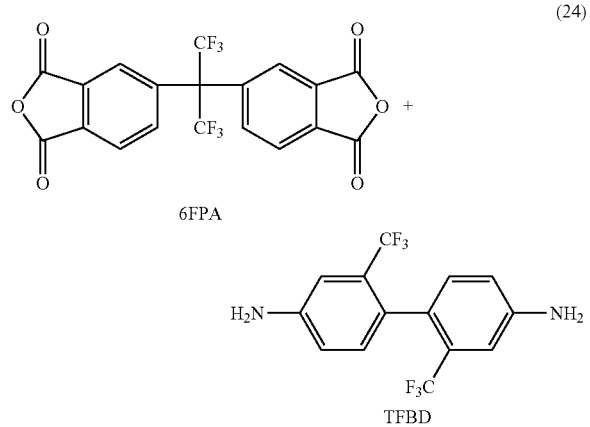

(24)

6FPA

TFBD

The weight average molecular weight of the above-described polyimide or polyamide resin preferably ranges from 3,000 to 500,000 inclusive, more preferably from 5,000 to 300,000, and further preferably from 10,000 to 200,000 inclusive. In cases where the weight average molecular weight is less than 3,000, the resin may not have enough strength; in cases where the weight average molecular weight is more than 500,000, the resin has an increased viscosity and a reduced solubility, which in turn may result in failure to provide a base material with smooth surface and homogeneous film thickness. In this specification, the "weight average molecular weight" is measured by gel permeation chromatography (GPC) as a value in terms of polystyrene.

Among the above-described polyimide and polyamide resins, the polyimide or polyamide resins having structures that inhibit intramolecular or intermolecular charge transfer are preferred due to the excellent transparency, specifically including the fluorinated polyimide resins represented by, for example, the above-described formulae (4) to (11), the polyimide resins containing alicyclic structures represented by, for example, the above-described formulae (13) to (16), and the halogenated polyamide resin represented by, for example, the above-described formula (23).

Additionally, the fluorinated polyimide resins represented by, for example, the above-described formulae (4) to (11) each contain a fluorinated structure and thus have a high heat resistance, which protects a base material composed of any of the polyimide resins from coloration by the heat generated during the synthesis of the polyimide resin and helps the polyimide resin to maintain excellent transparency.

As the resin base material 11, a base material composed of the fluorinated polyimide resin represented by, for example, any of the above-described formulae (4) to (11) or composed of the halogenated polyamide resin represented by, for example, the above-described formula (23) is preferably used because use of such a base material allows the resulting optical film to have a hardness of 3H or harder when measured under the same conditions of the pencil hardness test specified by JIS K5600-5-4: 1999 as those used for the surface 12A of the resin layer 12 (load: 1 kg, speed: 1 mm/sec). Among those base materials, a base material composed of the polyimide resin represented by the above-described formula (4) is more preferably used because use of the base material can provide excellent hardness with a pencil hardness of 3H or harder as described above to the resulting optical film.

Examples of the polyester resin include resins containing at least one of polyethylene terephthalate, polypropylene terephthalate, polybutylene terephthalate, and polyethylene naphthalate as a component.

<<Resin Layer>>

The resin layer 12 is a layer composed of a light-transmitting resin. The resin layer 12 is a layer with hard coat properties and impact absorbency. The resin layer may have a multi-layer structure composed of two or more resin layers. In cases where the resin layer has a multilayer structure, the resin layer may be a laminate comprising first, second, and third resin layers in this order, in which the second resin layer has a higher level of pencil hardness than the first resin layer and the third resin layer has a higher level of pencil hardness than the first and second resin layers and improves the scratch resistance. In this case, the surface of the third resin layer corresponds to the surface of the optical film. In cases where the third layer is formed directly on the surface of the first resin layer, the resulting optical film has improved scratch resistance but shows low foldability, which may cause a crack in the optical film. However, the second resin layer, which has a level of pencil hardness intermediate between those of the first and third resin layers, can be inserted between the first and third resin layers to inhibit the reduction of foldability as well as to improve the scratch resistance to a higher level.

The resin layer 12 preferably has a film thickness of 50 μm or more and 300 μm or less. In cases where the resin layer has a film thickness of less than 50 μm, the resin layer 12 is likely to have reduced hardness; additionally, in cases where the resin layer has a film thickness of more than 300 μm, the resin layer has an excessively thick film thickness and is thus not suitable for thickness reduction and is likely to reduce the processing properties. A cross-section of the resin layer 12 is photographed using a scanning electron microscope (SEM) and the film thickness of the resin layer 12 is measured at 20 different locations within the image of the cross-section, and the arithmetic mean of the 20 film thickness values is determined as the film thickness of the resin layer 12. The lower limit of the resin layer 12 is more preferably 80 μm or more in thickness, while the upper limit of the resin layer 12 is more preferably 250 μm or less in thickness.

The resin as a component of the resin layer 12 is not limited to a particular resin as long as the resin allows the resulting optical film 10 to have a shear storage elastic modulus (G') and a shear loss elastic modulus (G") within the above-described ranges at 25° C. in the frequency range from 500 Hz to 1000 Hz inclusive. Examples of such a resin include urethane-based resins, urethane-based gels, acryl-based gels, silicone-based gels, and epoxy resins. Among those, urethane-based resins are preferred in terms of providing superior foldability and excellent hardness with a pencil hardness of 3H or harder, because urethane resins are superior in toughness. The "gel" generally refers to a dispersion with high viscosity and no fluidity. Additionally, the resin layer 12 may contain a rubber or a thermoplastic elastomer in addition to, for example, a urethane resin or epoxy resin.

The urethane-based resin is a resin having urethane linkages. Examples of the urethane-based resin include a cured product of an ionizing radiation-curable urethane resin composition and a cured product of a thermosetting urethane resin composition. Among those urethane-based resins, the urethane-based resin is preferably a cured product of an ionizing radiation-curable urethane resin composition because the cured product provides scratch resistance and high hardness as well as is quickly cured and has high mass-productivity.

The ionizing radiation-curable urethane resin composition contains a urethane (meth)acrylate, while the thermosetting urethane resin composition contains a polyol compound and an isocyanate compound. The urethane (meth)acrylate, the polyol compound, and the isocyanate compound may each be any of monomer, oligomer, and prepolymer. Both "urethane acrylate" and "urethane methacrylate" are meant by the word "urethane (meth)acrylate."

The number of (meth)acryloyl groups (number of functional groups) in the urethane (meth)acrylate is preferably 2 or more and 4 or less. In cases where the number of (meth)acryloyl groups in the urethane (meth)acrylate is less than 2, the optical film is likely to have a lower level of pencil hardness; additionally, in cases where the number of (meth)acryloyl groups in the urethane (meth)acrylate is more than 4, the optical film is curled due to high cure shrinkage and is also likely to be cracked in the resin layer when being folded. The maximum number of (meth)acryloyl groups in the urethane (meth)acrylate is more preferably 3 or less. Both "acryloyl group" and "methacryloyl group" are meant by the word "(meth)acryloyl group."

The weight average molecular weight of the urethane (meth)acrylate is not limited to a particular molecular weight, and is preferably 1,500 or more and 20,000 or less. In cases where the weight average molecular weight of the urethane (meth)acrylate is less than 1,500, the optical film is likely to have a reduced impact resistance; additionally, in cases where the weight average molecular weight of the urethane (meth)acrylate is more than 20,000, the ionizing radiation-curable urethane resin composition is likely to have an increased viscosity and result in reduced coating performance. The minimum weight average molecular weight of the urethane (meth)acrylate is more preferably 2,000 or more, while the maximum weight average molecular weight of the urethane (meth)acrylate is more preferably 15,000 or less.

Additionally, examples of the repeating unit having a structure derived from a urethane (meth)acrylate include structures represented by the general formulae (25), (26), (27), and (28).

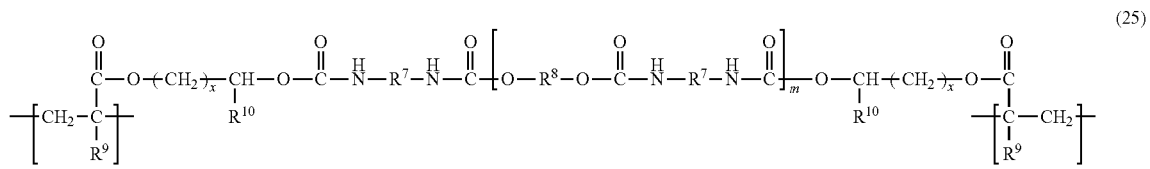

(25)

In the above-described general formula (25), $R^7$ represents a branched alkyl group; $R^8$ represents a branched alkyl or saturated alicyclic group; $R^9$ represents a hydrogen atom or methyl group; $R^{10}$ represents a hydrogen atom, methyl group, or ethyl group; m represents an integer of 0 or more; x represents an integer of 0 to 3.

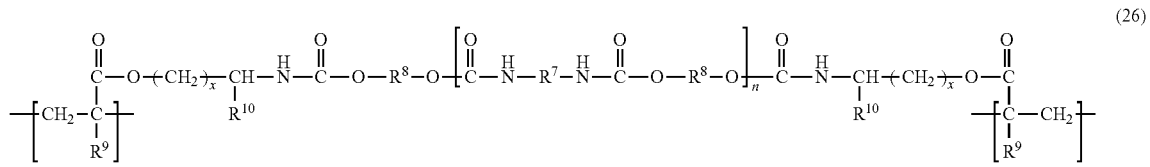

(26)

In the above-described general formula (26), $R^7$ represents a branched alkyl group; $R^8$ represents a branched alkyl or saturated alicyclic group; $R^9$ represents a hydrogen atom or methyl group; $R^{10}$ represents a hydrogen atom, methyl group, or ethyl group; n represents an integer of 1 or more; x represents an integer of 0 to 3.

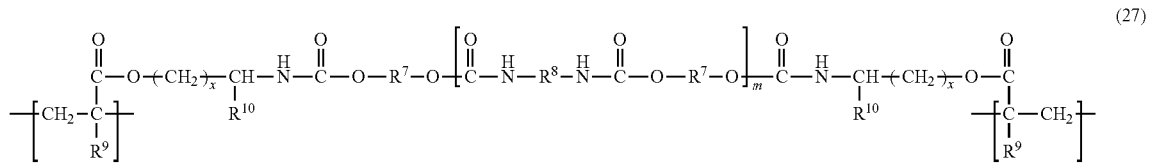

(27)

In the above-described general formula (27), $R^7$ represents a branched alkyl group; $R^8$ represents a branched alkyl or saturated alicyclic group; $R^9$ represents a hydrogen atom or methyl group; $R^{10}$ represents a hydrogen atom, methyl group, or ethyl group; m represents an integer of 0 or more; x represents an integer of 0 to 3.

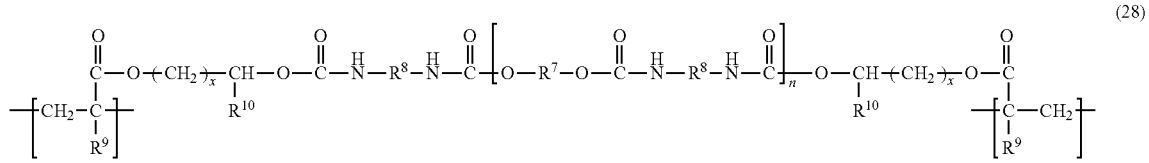

(28)

In the above-described general formula (28), $R^7$ represents a branched alkyl group; $R^8$ represents a branched alkyl or saturated alicyclic group; $R^9$ represents a hydrogen atom or methyl group; $R^{10}$ represents a hydrogen atom, methyl group, or ethyl group; n represents an integer of 1 or more; x represents an integer of 0 to 3.

(Acryl-Based Gel)

Various acryl-based gels can be used as long as those acryl-based gels are polymers produced by polymerization of monomers containing acrylic esters used for adhesives and the like. Specifically, an acryl-based gel obtained by polymerization or copolymerization of an acryl-based monomer, such as ethyl (meth)acrylate, n-propyl (meth) acrylate, i-propyl (meth)acrylate, n-butyl (meth)acrylate, i-butyl (meth)acrylate, 2-ethylhexyl (meth)acrylate, n-hexyl (meth)acrylate, n-amyl (meth)acrylate, i-amyl (meth)acrylate, octyl (meth)acrylate, i-octyl (meth)acrylate, i-myristyl (meth)acrylate, lauryl (meth)acrylate, nonyl (meth)acrylate, i-nonyl (meth)acrylate, i-decyl (meth)acrylate, tridecyl (meth)acrylate, stearyl (meth)acrylate, or i-stearyl (meth) acrylate, can be used as the acryl-based gel. In this specification, both "acrylate" and "methacrylate" are meant by the word "(meth)acrylate." The above-described acrylic esters used for the (co)polymerization may be used individually or in combination of two or more.

Analysis of the resin layer 12 by, for example, pyrolysis GC-MS and FT-IR can determine the structure of a polymer (a repeating unit) that constitutes the resin as a component of the resin layer 12. Particularly, pyrolysis GC-MS is useful because it can detect monomer units contained in the resin layer 12 as the monomer components.

The resin layer 12 may contain, for example, an ultraviolet absorber, a spectral transmittance modifier, an antifouling agent, inorganic particles, and/or organic particles as long as the resin layer allows the resulting optical film 10 to have a shear storage elastic modulus (G') and a shear loss elastic modulus (G") within the above-described ranges at 25° C. in the frequency range from 500 Hz to 1000 Hz inclusive.

<Ultraviolet Absorber>

Optical films are particularly suitably used in mobile terminals such as foldable smartphone and tablet terminal, and such mobile terminals are often used outdoors and thus each have a problem that a polarizer located closer to a display element than an optical film is easily degraded by exposure to ultraviolet light. However, in cases where a resin layer placed on the surface of a polarizer facing toward a display screen contains an ultraviolet absorber, the resin layer can advantageously prevent the polarizer from being degraded by exposure to ultraviolet light. The above-described ultraviolet absorber (UVA) may be contained in the resin base material 11. In this case, the ultraviolet absorber (UVA) may not be contained in the resin layer 12.

Examples of the ultraviolet absorber include triazine-based ultraviolet absorbers, benzophenone-based ultraviolet absorbers, and benzotriazole-based ultraviolet absorbers.

Examples of the above-described triazine-based ultraviolet absorber include 2-(2-hydroxy-4-[1-octyloxycarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2,4-bis[2-hydroxy-4-butoxyphenyl]-6-(2,4-dibutoxyphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-[4-[(2-hydroxy-3-(2'-ethyl)hexyl)oxy]-2-hydroxyphenyl]-4,6-bis(2,4-dimethylphenyl)-1,3,5-triazine. Examples of commercially available triazine-based ultraviolet absorbers include Tinuvin 460, Tinuvin 477 (both are manufactured by BASF SE), and LA-46 (manufactured by ADEKA Corporation).

Examples of the above-described benzophenone-based ultraviolet absorbers include 2-hydroxybenzophenone, 2,4-dihydroxybenzophenone, 2,2'-dihydroxy-4,4'-dimethoxybenzophenone, 2,2',4,4'-tetrahydroxybenzophenone, 2-hydroxy-4-methoxybenzophenone, hydroxymethoxybenzophenone sulfonate and its trihydrate, and sodium hydroxymethoxybenzophenone sulfonate. Examples of commercially available benzophenone-based ultraviolet absorbers include CHMASSORB 81/FL (manufactured by BASF SE).

Examples of the above-described benzotriazole-based ultraviolet absorbers include 2-ethylhexyl-3-[3-tert-butyl-4-hydroxy-5-(5-chloro-2H-benzotriazol-2-yl)phenyl]propionate, 2-(2H-benzotriazol-2-yl)-6-(linear and branched dodecyl)-4-methylphenol, 2-[5-chloro (2H)-benzotriazol-2-yl]-4-methyl-6-(tert-butyl)phenol, 2-(2H-benzotriazol-2-yl)-4,6-di-tert-pentylphenol, 2-(2'-hydroxy-5'-methylphenyl)benzotriazole, 2-(2'-hydroxy-3',5'-di-tert-butylphenyl)benzotriazole, 2-(2'-hydroxy-3'-tert-butyl-5'-methylphenyl)benzotriazole, 2-(2'-hydroxy-3',5'-di-tert-butylphenyl)-5-chlorobenzotriazole, 2-(2'-hydroxy-3'-(3'',4'',5'',6''-tetrahydrophthalimidomethyl)-5'-methylphenyl) benzotriazole, 2,2-methylenebis(4-(1,1,3,3-tetramethylbutyl)-6-(2H-benzotriazol-2-yl)phenol), and 2-(2'-hydroxy-3'-tert-butyl-5'-methylphenyl)-5-chlorobenzotriazole. Examples of commercially available benzotriazole-based ultraviolet absorbers include KEMISORB 71 D, KEMISORB 79 (both are manufactured by Chemipro Kasei Kaisha, Ltd.), JF-80, JAST-500 (both are manufactured by Johoku Chemical Co., Ltd.), ULS-1933D (manufactured by Ipposha Oil Industries Co., Ltd.), and RUVA-93 (manufactured by Otsuka Chemical Co., Ltd.).

Among those ultraviolet absorbers, triazine-based and benzotriazole-based ultraviolet absorbers are suitably used. The ultraviolet absorber is preferred to be highly soluble in a resin component that composes the resin layer and is also preferred to bleed less out from the resin layer after the above-described endurance and foldability test. The ultraviolet absorber has preferably been polymerized or oligomerized. As the ultraviolet absorber, polymers or oligomers containing the benzotriazole, triazine, or benzophenone backbone are preferred, specifically including ultraviolet absorbers obtained by thermal copolymerization of a (meth) acrylate containing the benzotriazole or benzophenone backbone and a methylmethacrylate (MMA) at an arbitrary ratio. In cases where the optical film is applied to an organic light-emitting diode (OLED) display device, the ultraviolet absorber can play a role in protection of the OLED from ultraviolet light.

The content of the ultraviolet absorber is not limited to a particular amount but is preferably 1 part by mass or more and 6 parts by mass or less relative to 100 parts by mass of solids in the resin layer composition. In cases where the content is less than 1 part by mass, the effect of incorporating the above-described ultraviolet absorber may not be well obtained; in cases where the content is more than 6 parts by mass, a marked coloration and a reduction of strength may occur on the resin layer. The minimum content of the above-described ultraviolet absorber is more preferably 2 parts by mass or more, while the maximum content of the above-described ultraviolet absorber is more preferably 5 parts by mass or less.

<Spectral Transmittance Modifier>

The spectral transmittance modifier is an agent for modifying the spectral transmittance of an optical film. When the resin layer contains, for example, the sesamol-type benzotriazole monomer represented by the general formula (29) below, the above-described spectral transmittance can advantageously be achieved.

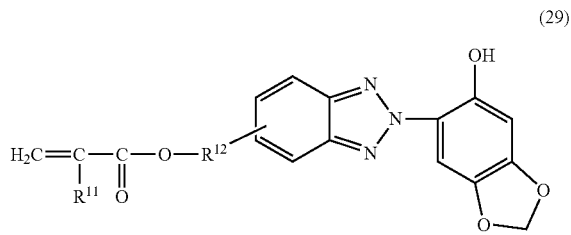

(29)

In the formula, $R^{11}$ represents a hydrogen atom or methyl group; $R^{12}$ represents a linear or branched alkylene or oxyalkylene group having 1 to 6 carbon atoms.

The above-described sesamol-type benzotriazole monomer is not limited to a particular sesamol-type benzotriazole monomer. Specific examples of the substance can include 2-[2-(6-hydroxybenzo[1,3]dioxol-5-yl)-2H-benzotriazole-5-yl]ethylmethacrylate, 2-[2-(6-hydroxybenzo[1,3]dioxol-5-yl)-2H-benzotriazole-5-yl]ethylacrylate, 3-[2-(6-hydroxybenzo[1,3]dioxol-5-yl)-2H-benzotriazole-5-yl]propylmethacrylate, 3-[2-(6-hydroxybenzo[1,3]dioxol-5-yl)-2H-benzotriazole-5-yl]propylacrylate, 4-[2-(6-hydroxybenzo[1,3]dioxol-5-yl)-2H-benzotriazole-5-yl]butylmethacrylate, 4-[2-(6-hydroxybenzo[1,3]dioxol-5-yl)-2H-benzotriazole-5-yl]butylacrylate, 2-[2-(6-hydroxybenzo[1,3]dioxol-5-yl)-2H-benzotriazole-5-yloxy]ethylmethacrylate, 2-[2-(6-hydroxybenzo[1,3]dioxol-5-yl)-2H-benzotriazole-5-yloxy]ethylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 4-[3-{2-(6-hydroxybenzo[1,3]dioxol-5-yl)-2H-benzotriazole-5-yl}propanoyloxy]butylmethacrylate, 4-[3-{2-(6-hydroxybenzo[1,3]dioxol-5-yl)-2H-benzotriazole-5-yl}propanoyloxy]butylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. Additionally, these sesamol-type benzotriazole monomers may be used individually or in combination of two or more.

The above-described sesamol-type benzotriazole monomer may be contained in the resin layer 12. In cases where the resin layer has a multilayer structure composed of two or more resin layers, the sesamol-type benzotriazole monomer may be contained in one or more resin layers to fulfill the requirements of the above-described spectral transmittance. In an exemplary configuration of the multilayer structure, for example, one of the resin layers contains a sesamol-type benzotriazole monomer as described above that enables spectral transmission of light only at a wavelength of 380 nm, and another resin layer contains sesamol-type benzotriazole monomers as described above that enable spectral transmission of light at a wavelength of 410 nm and at a wavelength of 440 nm. Furthermore, in a multilayer structure composed of three or more resin layers, each resin layer may contain a sesamol-type benzotriazole monomer as described above to fulfill the requirements of the above-described spectral transmittance.

In cases were the above-described sesamol-type benzotriazole monomer is contained in the resin layer 12, the above-described sesamol-type benzotriazole monomer is preferably contained in the resin layer 12, for example, at a content of 15 to 30% by mass. The presence of the sesamol-type benzotriazole monomer in such a content range allows the resin layer to achieve the above-described spectral transmittance. In the resin layer 12, the above-described sesamol-type benzotriazole monomer may react with a resin component that composes the resin layer 12 to be contained as a compound, or may not react with a resin component that composes the resin layer 12 to be contained individually.

<Antifouling Agent>

The antifouling agent may be evenly distributed in the resin layer, and is preferably unevenly distributed toward the surface of the resin layer to attain a sufficient antifouling effect with a small added amount of the antifouling agent and to prevent the resin layer from reducing the strength. Examples of a method of unevenly distributing the antifouling agent toward the surface of the resin layer include a method in which a coating film is prepared using the below-described resin layer composition, dried, and then heated before curing in the formation of a resin layer to reduce the viscosity of a resin component contained in the coating film, and thereby to increase the flowability of the antifouling agent, and consequently to distribute the antifouling agent unevenly toward the surface of the resin layer; and a method in which an antifouling agent with a low surface tension is chosen for use and a coating film is dried without heating to raise the antifouling agent to the surface of the coating film and the coating film is then cured to distribute the above-described antifouling agent unevenly toward the uppermost surface of the resulting resin layer.

The antifouling agent is not limited to a particular antifouling agent, but including, for example, silicone-based antifouling agents, fluorine-based antifouling agents, and silicone- and fluorine-based antifouling agents; those antifouling agents may be used individually or in combination. Additionally, the antifouling agent may be an acryl-based antifouling agent.

The content of the antifouling agent is preferably from 0.01 to 3.0 parts by weight relative to 100 parts by mass of the above-described resin component. In cases where the content is less than 0.01 parts by weight, the resin layer may not be allowed to attain a sufficient antifouling effect; additionally, in cases where the content is more than 3.0 parts by weight, the resin layer is likely to have reduced hardness.

The antifouling agent is a compound having preferably a weight average molecular weight of 5,000 or less and containing preferably one or more, more preferably two or more, reactive functional groups to improve the durability of antifouling effect. Among those antifouling agents, an antifouling agent containing two or more reactive functional groups can be used to provide excellent abrasion resistance.

In cases where the antifouling agent has no reactive functional group and the resulting optical film sheet is rolled or piled up, the antifouling agent moves toward the back surface of the optical film, which may cause separation of a layer of the optical film from another layer of the optical film and, furthermore, may cause separation of the layers after several rounds of the foldability test when one of the layers is laminated or applied to the back surface of the other.

Furthermore, the above-described antifouling agent containing a reactive functional group exhibits a durable antifouling effect, and a resin layer containing the above-described fluorine-based antifouling agent, among others, is fingerprint resistant (rendering fingerprints invisible) and also makes it easy to wipe off fingerprints. Furthermore, the above-described fluorine-based antifouling agent can reduce the surface tension generated during coating of a resin layer composition, which increases the leveling performance and assists in preparing a resin layer with a desirable appearance.

A resin layer containing a silicone-based antifouling agent has high smoothness and strong resistance against scratching with steel wool. An optical film having a resin layer that contains such a silicone-based antifouling agent provides smooth touch to a touch sensor covered with the optical film, and then offers a better tactile feeling when the touch sensor is touched with a finger or pen. Additionally, the resin layer is fingerprint resistant (rendering fingerprints invisible) and also makes it easy to wipe off fingerprints. Furthermore, the above-described silicone-based antifouling agent can reduce the surface tension generated during coating of a resin layer composition, which increases the leveling performance and assists in preparing a resin layer with a desirable appearance.

Examples of commercially available silicone-based antifouling agents include SUA-1900L10 (manufactured by Shin-Nakamura Chemical Co., Ltd.), SUA-1900L6 (manufactured by Shin-Nakamura Chemical Co., Ltd.), Ebecryl1360 (manufactured by Daicel-Cytec Ltd.), UT3971 (manufactured by The Nippon Synthetic Chemical Industry Co., Ltd.), BYK-UV 3500 (manufactured by BYK Japan KK), BYK-UV 3510 (manufactured by BYK Japan KK), BYK-UV 3570 (manufactured by BYK Japan KK), X22-164E, X22-174B X, X22-2426, KBM-503, KBM-5103 (manufactured by Shin-Etsu Chemical Co., Ltd.), TEGO-Rad 2250, TEGO-Rad 2300, TEGO-Rad 2200N, TEGO-Rad 2010, TEGO-Rad 2500, TEGO-Rad 2600, TEGO-Rad 2700 (manufactured by Evonik Japan Co., Ltd.), and MEGAFACE RS-854 (manufactured by DIC Corporation).

Examples of commercially available fluorine-based antifouling agents include OPTOOL DAC, OPTOOL DSX (manufactured by Daikin Industries, Ltd.), MEGAFACE RS-71, MEGAFACE RS-74 (manufactured by DIC Corporation), LINC152EPA, LINC151EPA, LINC182UA (manufactured by Kyoeisha Chemical Co., Ltd.), FUTARGENT 650A, FUTARGENT 601AD, and FUTARGENT 602.

Examples of commercially available fluorine- and silicone-based antifouling agents containing a reactive functional group include MEGAFACE RS-851, MEGAFACE RS-852, MEGAFACE RS-853, MEGAFACE RS-854 (manufactured by DIC Corporation), OPSTAR TU2225, OPSTAR TU2224 (manufactured by JSR Corporation), and X71-1203M (manufactured by Shin-Etsu Chemical Co., Ltd.).

<<Optical Film Production Method>>

The optical film 10 can be produced by various methods according to the type of a resin as a component of the resin layer 12. For example, in cases where the resin layer 12 is a layer composed of a urethane-based resin, the resin layer can be produced, for example, as follows. First, a resin layer composition is applied on one surface 11A of the resin base material 11 by a coating apparatus such as bar coater to form a coating film of the resin composition.

<Resin Layer Composition>

The resin layer composition contains a urethane (meth)acrylate or polyol compound and an isocyanate compound. The resin layer composition may additionally contain an ultraviolet absorber, a spectral transmittance modifier, an antifouling agent, inorganic particles, a leveling agent, a solvent, and a polymerization initiator, as necessary.

The content of total solids in the resin layer composition is preferably from 25 to 95%. In cases where the content is less than 25%, the resulting coating film is likely to contain a residual solvent or to turn white in color. In cases where the content is more than 55%, the resin layer composition has an increased viscosity and results in reduced coating performance, which may cause surface unevenness and surface streaks. The content of the above-described solids is more preferably from 30 to 50%.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cyclohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, n-methylpyrrolidone), ethers (for example, diethyl ether, dioxane, tetrahydrofurane), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives and thereby to apply the above-described resin layer composition in a suitable manner.

<Polymerization Initiator>

The polymerization initiator is a component which degrades, when exposed to ionizing radiation or heat, and generates radicals to initiate or promote polymerization (cross-linking) of a polymerizable compound.

The polymerization initiator is not limited to a particular polymerization initiator as long as it can generate a substance that initiates a radical polymerization by exposure to ionizing radiation or heat. Any known polymerization initiator can be used without any particular limitation, and specific examples include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

After the coating film of the resin layer composition is formed, the coating film is dried and then exposed to ionizing radiation or heat to cure the coat film of the resin layer composition and subsequently to form the resin layer 12. Consequently, the optical film 10 shown in FIG. 1 is obtained.

<<<Image Display Device>>>

Figure 3:
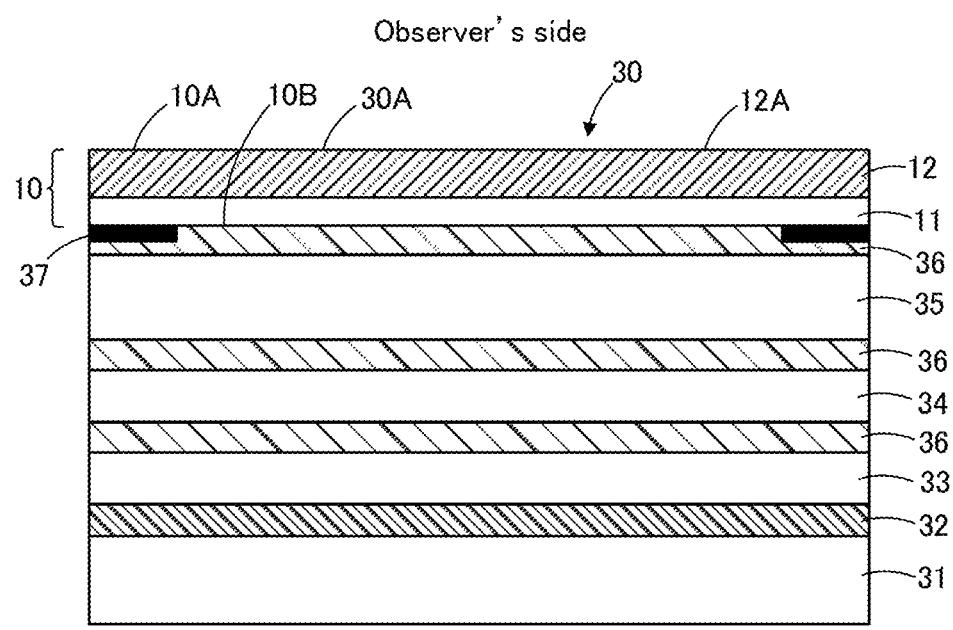
FIG. 3 depicts the schematic diagram of an image display device according to the first embodiment.

The optical film 10 may be incorporated into a foldable image display device and then used. FIG. 3 depicts the schematic diagram of the image display device according to the present embodiment. As shown in FIG. 3, a housing 31 for accommodating a battery and the like, a protective film 32, a display panel 33, a touch sensor 34, a circularly polarizing plate 35, and the optical film 10 are generally laminated in this order toward the observer in the image display device 30. A light-transmitting adhesive 36 such as, for example, OCA (optical clear adhesive) is placed between the display panel 33 and the touch sensor 34, between the touch sensor 34 and the circularly polarizing plate 35, and between the circularly polarizing plate 35 and the optical film 10, and these members are anchored to each other with the light-transmitting adhesive 36. Additionally, a black layer 37 is provided on a portion of the back surface 10B of the optical film 10.

In the optical film 10, the resin layer 12 is located on the observer's side of the resin base material 11. For the image display device 30, the surface 12A of the resin layer 12 in the optical film 10 is configured to be the surface 30A of the image display device 30.

In the image display device 30, the display panel 33 is an organic light-emitting diode panel containing an organic light-emitting diode and the like. The touch sensor 34 is located closer to the display panel 33 than the circularly polarizing plate 35 but may be placed between the circularly polarizing plate 35 and the optical film 10. Additionally, the touch sensor 34 may be an on-cell type or an in-cell type.

The shear loss tangent (tan δ) is conventionally known as an index representing the degree of impact absorbency. Thus, the impact resistance of an optical film comprising a resin layer on a resin base material may be expressed by a value of shear loss tangent (tan δ). However, when an impact was applied to the surface of the optical film (the surface of the resin layer), it failed to inhibit both depression on the surface of the optical film and damage to members located interior to the optical film in an image display device on the basis of a value of the shear loss tangent (tan δ). This is considered to be related to the fact that the shear loss tangent (tan δ) is the ratio (G"/G') between the shear loss elastic modulus (G") and the shear storage elastic modulus (G'). The inventors intensively studied further and consequently found that the balance between the shear storage elastic modulus (G') and the shear loss elastic modulus (G") is critical to inhibit both depression on the surface of the optical film and damage to members located interior to the optical film in an image display device when an impact is applied to the surface of the optical film. In the optical film 10 comprising the resin layer 12 on the resin base material 11 according to the present embodiment, the above-described shear storage elastic modulus (G') of the optical film 10 is 1 MPa or more and 200 MPa or less and the above-described shear loss elastic modulus (G") of the optical film 10 is 0.1 MPa or more and 100 MPa or less. Thus, the optical film 10 can be folded, as well as can inhibit both depression on the surface 10A of the optical film 10 and damage to members such as the display panel 33 located inside of the image display device 30 when an impact is applied to the surface 10A. Consequently, an excellent impact resistance can be achieved.

Second Embodiment

Figure 4:
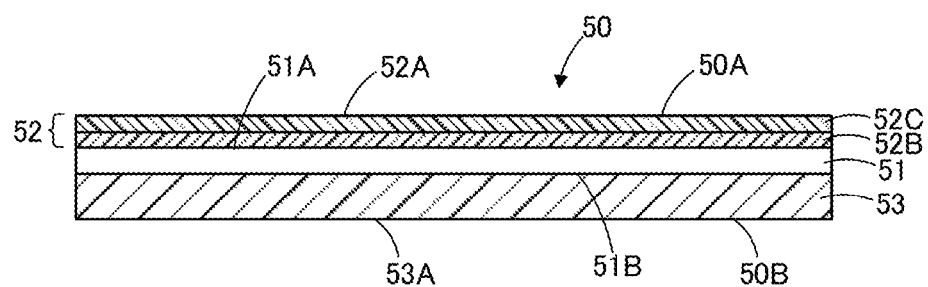
FIG. 4 depicts the schematic diagram of an optical film according to the second embodiment.

An optical film, a laminate, a polarizing plate and an image display device according to the second embodiment of the present invention are now described with reference to the drawings. FIG. 4 depicts the schematic diagram of the polarizing plate in which the optical film according to the present embodiment is incorporated.

<<Optical Film>>

An optical film 50 shown in FIG. 4 is used in an image display device and is foldable and light transmissive.

The optical film 50 comprises a resin base material 51, a hard coat layer 52 provided on one surface 51A of the resin base material 51, and a resin layer 53 provided on the other surface 51B of the resin base material 51, which is opposite to the one surface 51A. A mold release film may be provided on a surface of the resin layer 53 opposite to the resin base material 51 side surface. However, the physical properties and the like of the optical film 50 described in this specification represent values measured in the optical film without a mold release film and the mold release film is peeled off from the optical film before use. Thus, the mold release film is not an integral part of the optical film.

In FIG. 4, the surface 50A of the optical film 50 corresponds to the surface 52A of the hard coat layer 52. The back surface 50B of the optical film 50 corresponds to the surface 53A of the resin layer 53, which is opposite to the resin base material 51 side surface.

In the optical film 50, the shear storage elastic modulus (G') at 25° C. in the frequency range from 500 Hz to 1000 Hz inclusive is 1 MPa or more and 200 MPa or less. In cases where the shear storage elastic modulus (G') of the optical film is less than 1 MPa, the surface of the optical film is likely to be largely deformed by an impact applied to the film surface and the resin layer is also likely to reduce the hardness. Additionally, in cases where the shear storage elastic modulus (G') of the optical film is more than 200 MPa, the optical film is likely to be cracked when folded. The upper limit of shear storage elastic modulus (G') in the optical film 50 is preferably 100 MPa or less, more preferably 50 MPa or less.

In the optical film 50, the shear loss elastic modulus (G") at 25° C. in the frequency range from 500 Hz to 1000 Hz inclusive is 0.1 MPa or more and 100 MPa or less. In cases where the shear loss elastic modulus (G") of the optical film is less than 0.1 MPa, the impact-absorbing capacity of the optical film is likely to be reduced. Additionally, in cases where the shear loss elastic modulus (G") of the optical film is more than 100 MPa, the resin layer is likely to reduce the hardness. The lower limit of shear loss elastic modulus (G") in the optical film 50 is preferably 0.5 MPa or more, while the upper limit of shear loss elastic modulus (G") in the optical film 50 is preferably 50 MPa or less.

The shear storage elastic modulus (G') and shear loss elastic modulus (G") of the optical film 50 can be measured similarly to the shear storage elastic modulus (G') and shear loss elastic modulus (G") of the optical film 10.

The optical film 50 is foldable. Specifically, no crack or break is formed in the optical film 50 even in cases where the foldability test is repeated on the optical film 50 preferably one hundred thousand times, more preferably two hundred thousand times, and further preferably one million times. In cases where the foldability test is repeated on the optical film 50 one hundred thousand times and the optical film 50 is, for example, cracked, the optical film 50 shows low foldability. The foldability test may be carried out by folding the optical film 50 with the hard coat layer 52 facing either inward or outward. In either case, no crack or break is preferably formed in the optical film 50. The foldability test is the same as the foldability test described in the first embodiment and the description is thus omitted here.

The surface 50A of the optical film 50 (the surface 52A of the hard coat layer 52) preferably has a hardness (pencil hardness) of B or more, more preferably H, when measured by the pencil hardness test specified by JIS K5600-5-4: 1999. The pencil hardness of the optical film 50 can be measured by the same method as for the pencil hardness of the optical film 10.

The optical film 50 preferably has a yellow index (YI) of 15 or less for the same reason as described for the optical film 10. The yellow index of the optical film 50 can be measured by the same method as for the yellow index of the optical film 10. The upper limit of yellow index (YI) in the optical film 50 is more preferably 10 or less. The yellow index (YI) of the optical film 50 may be adjusted similarly to the optical film 10, for example, by adding a blue coloring substance to the resin base material 51 or the resin layer 53. The same blue coloring substances as those described for the optical film 10 can be used as the blue coloring substance.

The optical film 50 preferably has a light transmittance of 8% or less at a wavelength of 380 nm for the same reason as described for the optical film 10. The light transmittance of the optical film 50 at a wavelength of 380 nm can be measured by the same method as for the light transmittance of the optical film 10 at a wavelength of 380 nm. The maximum light transmittance of the optical film 50 is more preferably 5%. The above-described transmittance of the optical film 50 can be achieved by adjusting the amount of the below-described ultraviolet absorber added to the resin layer 53.

The optical film 50 preferably has a haze value (total haze value) of 2.5% or less for the same reason as described for the optical film 10. The haze value of the optical film 50 can be measured by the same method as for the haze value of the optical film 10. The above-described haze value is more preferably 1.5% or less, still more preferably 1.0% or less. The above-described haze value of the optical film 50 can be achieved by adjusting the amount of the below-described ultraviolet absorber added to the resin layer 53.

The optical film 50 is also preferred to have a spectral transmittance of less than 1% at a wavelength of 380 nm, a spectral transmittance of less than 10% at a wavelength of 410 nm, and a spectral transmittance of 70% or more at a wavelength of 440 nm for the same reason as described for the optical film 10.

Preferably, the optical film 50 has a transmittance of nearly 0% for light with a wavelength of up to 380 nm, gradually increases the light transmittance above a wavelength of 410 nm, and exhibits a sharp increase of light transmittance around a wavelength 440 nm. Specifically, the spectral transmittance of the optical film preferably varies sigmoidally with the wavelength, for example, from 410 nm to 440 nm. The above-described optical film more preferably has a spectral transmittance of less than 0.5%, further preferably less than 0.2%, at a wavelength of 380 nm; a spectral transmittance of less than 7%, further preferably less than 5%, at a wavelength of 410 nm; and a spectral transmittance of 75% or more, further preferably 80% or more, at a wavelength of 440 nm. The optical film 50 preferably has a spectral transmittance of less than 50% at a wavelength 420 nm.

The optical film 50 more preferably has a spectral transmittance of less than 0.1% at a wavelength of 380 nm, a spectral transmittance of less than 7% at a wavelength of 410 nm, and a spectral transmittance of 80% or more at a wavelength of 440 nm.

For the same reason as described for the optical film 10, the slope as a function of wavelength obtained by the least square method applied to the transmittance of the optical film 50 is preferably more than 2.0 in a spectrum range from 415 to 435 nm, as well as the optical film 50 preferably has a blue light blocking rate of 40% or more. The above-described slope and blue light blocking rate can be measured by the same methods as for the slope and the blue light blocking rate of the optical film 10.

The optical film 50 can be cut into a desired size or may be rolled. In cases where the optical film 50 is cut into a desired size, the optical film is not limited to a particular size, and the size of the film is appropriately determined depending on the display size of an image display device such as, for example, smartphone, tablet terminal, personal computer (PC), wearable terminal, digital signage, or television. Specifically, the optical film 50 may be, for example, not less than 1 inch and not more than 500 inch in size.

The optical film 50 installed in an image display device may be located inside the image display device, and is preferably on the surface of the image display device. In cases of being located on the surface of an image display device, the optical film 50 serves as a cover film, which is used instead of a cover glass.

<<Resin Base Material>>

The resin base material 51 is a base material composed of a light-transmitting resin. The resin base material 51 is similar to the resin base material 11 and the description is thus omitted here.

<<Hard Coat Layer>>

The hard coat layer 52 will refer to a layer having a Martens hardness of 375 MPa or more at half the height of the cross-section of the hard coat layer 52. In this specification, the "Martens hardness" refers to a hardness measured when an indenter is pressed into a specimen to a depth of 500 nm in a nanoindentation hardness test. Measurement of the Martens hardness based on the above-described nanoindentation technique will be performed on a measurement sample using a "TI950 TriboIndenter" manufactured by Hysitron, Inc. Specifically, a piece of an optical film with a size of 1 mm×10 mm is cut from the optical film and embedded in an embedding resin to prepare a block, and homogeneous sections having a thickness of 70 nm or more and 100 nm or less and having no openings or the like are sliced from the block according to a commonly used sectioning technique. For the preparation of sections, an "Ultramicrotome EM UC7" (Lica Microsystems GmbH) and the like can be used. Then, the block remaining after slicing the sections is used as a measurement sample. Subsequently, in the cross-section of the measurement sample obtained after slicing the above-described sections, a Berkovich indenter (trigonal pyramid) as the above-described indenter is pressed into the hard coat layer at half the height of the cross-section to a depth of 500 nm, held at the position for a certain period of time to relax the residual stress, and then unloaded, under the following measurement conditions to measure the maximum load after the relaxation, and the maximum load $P_{max}$ (μN) and the area of the 500 nm deep indentation A (nm$^2$) are used to calculate the Martens hardness from the value of $P_{max}$/A. The arithmetic mean of the measurements at 10 different locations is determined as the Martens hardness.

(Measurement Conditions)
loading speed: 10 nm/sec;
dwell time: 5 sec;
unloading speed: 10 nm/sec;
measurement temperature: 25° C.

The hard coat layer 52 preferably has a film thickness of 1 μm or more 20 μm or less. In cases where the hard coat layer has a film thickness of less than 1 μm, the hard coat layer 52 is likely to have reduced hardness; additionally in cases where the hard coat layer has a film thickness of more than 20 μm, the hard coat layer has an excessively thick film thickness and is thus likely to reduce the processing properties. The "film thickness of the hard coat layer" as used herein will refer to the sum of the film thickness (total thickness) of hard coat layers in cases where the hard coat layer has a multilayer structure. A cross-section of the hard coat layer 52 is photographed using a scanning electron microscope (SEM) and the film thickness of the hard coat layer 52 is measured at 20 different locations within the image of the cross-section, and the arithmetic mean of the 20 film thickness values is determined as the film thickness of the hard coat layer 52. The upper limit of the hard coat layer 52 is more preferably 15 μm or less in thickness, further preferably 10 μm or less in thickness.

The hard coat layer may have a monolayer structure, and preferably has a multilayer structure composed of two or more hard coat layers in terms of improving the foldability. The hard coat layer 52 illustrated in FIG. 4 is configured from a first hard coat layer 52B and a second hard coat layer 52C laminated to the first hard coat layer 52B.

<First Hard Coat Layer>

The first hard coat layer 52B is a layer mainly for providing hardness to the optical film. The first hard coat layer 52B preferably has a Martens hardness of 500 MPa or more and 1000 MPa or less at half the height of the first hard coat layer 52B. In cases where the Martens hardness is less than 500 MPa, the hard coat layer may have insufficient hardness; in cases where the Martens hardness is more than 1000 MPa, the resulting optical film may show low foldability. The minimum Martens hardness at half the height of the first hard coat layer 52B is preferably 600 MPa or more, while the maximum Martens hardness at the same position is preferably 950 MPa or less.

The Martens hardness of the first hard coat layer 52B is preferably larger than the Martens hardness of the second hard coat layer 52C. The optical film 50 has a particularly desirable pencil hardness based on such relationship in the Martens hardness. This is because deformation is suppressed and a less severe form of scratch or depression is formed in the optical film 50 when a load is applied to press the point of a pencil down onto the optical film 50 in the pencil hardness test. Examples of a method of increasing the Martens hardness of the first hard coat layer 52B above the Martens hardness of the second hard coat layer 52C include a method in which the content of the below-described inorganic particles is adjusted so that the first hard coat layer 52B contains a larger amount of the inorganic particles than the second hard coat layer 52C. Additionally, in cases where the hard coat layer has a monolayer structure, inorganic particles are preferred to be unevenly distributed in the hard coat layer toward the resin base material; that is, the content of the inorganic particles in the above-described hard coat layer is preferred to increase toward the resin base material and to decrease toward the surface of the optical film.

The first hard coat layer 52B contains a resin. The first hard coat layer 52B preferably further contains inorganic particles dispersed in the resin.

(Resin)

The resin comprises a polymerized product (a cured product) of a polymerizable compound (a curable compound). The polymerizable compound refers to a molecule having at least one polymerizable functional group. Examples of the polymerizable functional group include ethylenic unsaturated groups such as (meth)acryloyl group, vinyl group, and allyl group. Both "acryloyl group" and "methacryloyl group" are meant by the word "(meth)acryloyl group."

The polymerizable compound is preferably a polyfunctional (meth)acrylate. Examples of the above-described polyfunctional (meth)acrylate include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyesterdi(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth)acrylate, ditrimethylolpropane tetra(meth)acrylate, and those compounds modified with PO, EO, caprolactone, or the like.

Among those polyfunctional polymerizable compounds, polymerizable compounds with three to six functional groups trifunctional, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate, are preferred in terms of the ability to achieve the above-described Martens hardness in a suitable manner. In this specification, the word "(meth)acrylate" means acrylate and methacrylate.

The polymerizable compound may further comprise a monofunctional (meth)acrylate monomer for the purpose of, for example, adjusting the hardness of the resin and the viscosity of the composition, and improving the adhesiveness of the resin. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The weight average molecular weight of the above-described monomer is preferably less than 1,000, more preferably 200 or more and 800 or less, in terms of improving the hardness of the resin layer. Additionally, the weight average molecular weight of the above-described polymerizable oligomer is preferably 1,000 or more and 20,000 or less, more preferably 1,000 or more and 10,000 or less, and further preferably 2,000 or more and 7,000 or less.

(Inorganic Particles)

The inorganic particles are not limited to a particular type of inorganic particles as long as those inorganic particles can improve the hardness of the hard coat layer, and silica particles are preferred in terms of the ability to achieve excellent hardness. Among silica particles, reactive silica particles are preferred. The above-described reactive silica particle can form a cross-linked structure with the above-described polyfunctional (meth)acrylate and the presence of the reactive silica particles can sufficiently increase the hardness of the first hard coat layer 52B.

The above-described reactive silica particle preferably carries a reactive functional group on the surface, and a polymerizable functional group, such as those described above, is suitably used as the reactive functional group.

The above-described reactive silica particles are not limited to a particular type of reactive silica particles, and conventionally known reactive silica particles, such as reactive silica particles described in Japanese Patent Application Publication 2008-165040, can be used. Additionally, examples of commercially available reactive silica particles as describe above include MIBK-SD, MIBK-SD-MS, MIBK-SD-L, and MIBK-SD-ZL manufactured by Nissan Chemical Industries, Ltd.; and V8802 and V8803 manufactured by JGC C&C.

Additionally, the above-described silica particles may be spherical silica particles and are preferably deformed silica particles. Spherical silica particles may be combined with deformed silica particles. In this specification, the "spherical silica particle" refers to, for example, a spherical or ellipsoidal silica particle, while "deformed silica particle" refers to a silica particle with a randomly rough surface as observed on potato tubers. The surface area of the above-described deformed silica particle is larger than that of a spherical silica particle, and the presence of such deformed silica particles thus increases the contact area with, for example, the above-described polyfunctional (meth)acrylate and successfully improves the hardness of the above-described hard coat layer. Observation of the cross-section of the hard coat layer can determine whether or not the reactive silica particles are deformed silica particles as described above.

The average particle diameter of the above-described silica particles is preferably 5 nm or more and 200 nm or less. In cases where the average particle diameter is less than 5 nm, the production of silica particles with such a particle diameter is difficult, and such silica particles may aggregate each other or have a great difficulty in modification to produce a randomly rough surface, or, furthermore, deformed silica particles with such a particle diameter are less dispersible and may aggregate each other in the above-described composition before use for coating. On the other hand, the average particle diameter of the above-described deformed silica particle is more than 200 nm, problems such as formation of major convexes and concaves on the hard coat layer or increase of haze may occur. In cases where the silica particles are spherical silica particles, the average particle diameter of the silica particles corresponds to a value measured using image processing software from an image obtained by a transmission electron microscope (TEM) or a scanning transmission electron microscope (STEM). Additionally, in cases where the silica particles are deformed silica particles, the average particle diameter of the silica particles corresponds to the average between the maximum (major axis) and minimum (minor axis) values of the distance between two points on the circumference of each deformed silica particle observed in the microscopy of the cross-section of the above-described hard coat layer.

The hardness (Martens hardness) of the first hard coat layer 52B can be controlled by adjusting the size and content of the above-described inorganic particles. For example, the above-described silica particles having a diameter of 5 nm or more and 200 nm or less are preferably contained in an amount of 25 to 60 parts by mass relative to 100 parts by mass of the above-described polymerizable compound in the preparation of the first hard coat layer 52B.

<Second Hard Coat Layer>

The second hard coat layer 52C is a layer provided to satisfy the requirement of the above-described foldability test. The second hard coat layer 52C preferably has a Martens hardness of 375 MPa or more and 1500 MPa or less at half the height of the second hard coat layer 52C. In cases where the Martens hardness is less than 375 MPa, the hard coat layer may have insufficient scratch resistance; in cases where the Martens hardness is more than 1500 MPa, the resulting optical film may have insufficient folding resistance and be unable to satisfy the requirement of the above-described foldability test. The minimum Martens hardness at half the height of the second hard coat layer 52C is more preferably 450 MPa or more, while the maximum Martens hardness at the same position is more preferably 575 MPa or less.

The second hard coat layer 52C contains a resin. The second hard coat layer 52C may further contain inorganic particles dispersed in the resin.

(Resin)

The resin comprises a polymerized product (a cured product) of a polymerizable compound (a curable compound). The polymerizable compound is preferably a polyfunctional (meth)acrylate. The above-described polyfunctional (meth)acrylate include the same polyfunctional (meth)acrylates as described for the first hard coat layer 52B. Additionally, the second hard coat layer 52C may contain, for example, polyfunctional urethane (meth)acrylate and/or polyfunctional epoxy (meth)acrylate, in addition to the above-described polyfunctional (meth)acrylate.

(Inorganic Particles)

The inorganic particles include the same types of inorganic particles as described for the first hard coat layer 52B. The content of the inorganic particles in the second hard coat layer 52C is not limited to a particular content, and is preferably, for example, 0 to 50% by mass relative to the second hard coat layer 52C.

At least either the first hard coat layer 52B or the second hard coat layer 52C may contain any materials other than the above-described materials as long as the above-described Martens hardness is achieved. For example, a polymerizable monomer, oligomer, or the like which forms a cured product upon exposure to ionizing radiation may be additionally contained as a resin component material. As the above-described polymerizable monomer or oligomer, (meth)acrylate monomers or oligomers each containing a radical polymerizable unsaturated group in the molecule are included. Examples of the above-described (meth)acrylate monomers or oligomers each containing a radical polymerizable unsaturated group in the molecule include monomers or oligomers of, for example, urethane (meth)acrylate, polyester (meth)acrylate, epoxy (meth)acrylate, melamine (meth)acrylate, polyfluoroalkyl (meth)acrylate, and silicone (meth)acrylate. These polymerizable monomers or oligomers may be used individually or in combination of two or more. Among those monomers or oligomers, a monomer or oligomer of polyfunctional (hexafunctional or higher) urethane (meth)acrylate with a weight average molecular weight of 1,000 to 10,000 is preferred.

The hard coat layer 52 (at least either the first hard coat layer 52B or the second hard coat layer 52C) may further contain an ultraviolet absorber, a spectral transmittance modifier, and/or an antifouling agent. The ultraviolet absorber, the spectral transmittance modifier, and the antifouling agent are the same as the ultraviolet absorber, spectral transmittance modifier, and antifouling agent described in the first embodiment and the description is thus omitted here.

<<Resin Layer>>

The resin layer 53 is a layer composed of a light-transmitting resin. The resin layer 53 is a layer with impact absorbency. The resin layer may have a multilayer structure composed of two or more resin layers.

The resin layer 53 has a film thickness of 30 µm or more and less than 200 µm. In cases where the resin layer 53 has a film thickness of less than 30 µm, the resin layer may have reduced hardness; additionally, in cases where the resin layer has a film thickness of 200 µm or more, the resin layer has an excessively thick film thickness and is thus not suitable for thickness reduction and is likely to reduce the processing properties. A cross-section of the resin layer 53 is photographed using a scanning electron microscope (SEM) and the film thickness of the resin layer 53 is measured at 20 different locations within the image of the cross-section, and the arithmetic mean of the 20 film thickness values is determined as the film thickness of the resin layer 53. The lower limit of the resin layer 53 is preferably 40 µm or more in thickness, while the upper limit of the resin layer 53 is preferably 180 µm or less, more preferably 150 µm or less, and further preferably 100 µm or less in thickness. In this specification, the phrase "less than" will be used to indicate a range of values smaller than the reference value, from which the reference value is excluded. For example, the phrase "less than 200 µm" does not include a value of 200 µm.

The resin as a component of the resin layer 53 is not limited to a particular resin as long as the resin allows the resulting optical film 50 to have a shear storage elastic modulus (G') and a shear loss elastic modulus (G") within the above-described ranges at 25° C. in the frequency range from 500 Hz to 1000 Hz inclusive. Examples of such a resin include acryl-based gels, urethane-based gels, silicone-based gels, urethane-based resins, and epoxy-based resins. Among those resins, acryl-based gels are preferred. Additionally, the resin layer 53 may contain a rubber or a thermoplastic elastomer in addition to, for example, an acryl-based gel or urethane-based resin. The acryl-based gel and the urethane-based resin are the same as the acryl-based gel and urethane-based resin described for the resin layer 12 and the description is thus omitted here.

The resin layer 53 may contain, for example, an ultraviolet absorber, a spectral transmittance modifier, an antifouling agent, inorganic particles, and/or organic particles as long as the resin layer allows the resulting optical film 50 to have a shear storage elastic modulus (G') and a shear loss elastic modulus (G") within the above-described ranges at 25° C. in the frequency range from 500 Hz to 1000 Hz inclusive. The additional components such as ultraviolet absorber described for the hard coat layer 52 can be used as the additional components such as ultraviolet absorber and the description is thus omitted here.

<<Optical Film Production Method>>

The optical film 50 can be produced by various methods according to the type of a resin as a component of the resin layer 53. For example, in cases where the resin layer 53 is a layer composed of an acryl-based gel, the resin layer can be produced, for example, as follows. First, a first hard coat layer composition is applied on one surface 51A of the resin base material 51 by a coating apparatus such as bar coater to form a coating film of the first hard coat layer composition.

<First Hard Coat Layer Composition>

The first hard coat layer composition contains a polymerizable compound for forming the first hard coat layer 52B. The first hard coat layer composition may additionally contain an ultraviolet absorber, a spectral transmittance modifier, an antifouling agent, inorganic particles, a leveling agent, a solvent, and a polymerization initiator, as necessary. The solvent and the polymerization initiator are the same as the solvent and polymerization initiator described in the first embodiment and the description is thus omitted here.

After the coating film of the first hard coat layer composition is formed, the coating film is heated and dried at a temperature of, for example, 30° C. or higher and 120° C. or lower for a period of 10 to 120 seconds by various known techniques to evaporate the solvent.

After drying the coating film, the coating film is exposed to ionizing radiation such as ultraviolet light, and the coating film is thereby semi-cured (half cured). The term "semi-cured" as used herein means that curing substantially proceeds upon further exposure to ionizing radiation. However, the coating film may be completely cured (full-cured) at this step. The phrase "completely cured" as used herein means that curing substantially no more proceeds in spite of further exposure to ionizing radiation.

After the coating film is semi-cured, a second hard coat layer composition to form the second hard coat layer 52C is applied on the coating film by a coating apparatus such as bar coater to form a coating film of the second hard coat layer composition.

<Second Hard Coat Layer Composition>

The second hard coat layer composition contains a polymerizable compound for forming the second hard coat layer 52C. The second hard coat layer composition may additionally contain an ultraviolet absorber, a solvent, and a polymerization initiator, as necessary. The content of total solids in the second hard coat layer composition is preferably from 25 to 55%, similarly to the first hard coat layer composition. The solvent and the polymerization initiator are the same as the solvent and polymerization initiator described for the first hard coat layer composition and the description is thus omitted here.

After the coating film of the second hard coat layer composition is formed, the coating film is heated and dried at a temperature of, for example, 30° C. or higher and 120° C. or lower for a period of 10 to 120 seconds by various known techniques to evaporate the solvent.

After drying the coating film, the coating film of the second hard coat layer composition is exposed to ionizing radiation such as ultraviolet light, the coating films of the first and second hard coat layer compositions are thereby completely cured (full-cured) to form the first hard coat layer 52B and the second hard coat layer 52C, and thereby to obtain the hard coat layer 52. Subsequently, the resin layer 53 is laminated to the other surface 51B of the resin base material 51, which is opposite to the surface where the hard coat layer 52 is formed. Consequently, the optical film 50 shown in FIG. 4 is obtained.

<<<Image Display Device>>>

Figure 5:
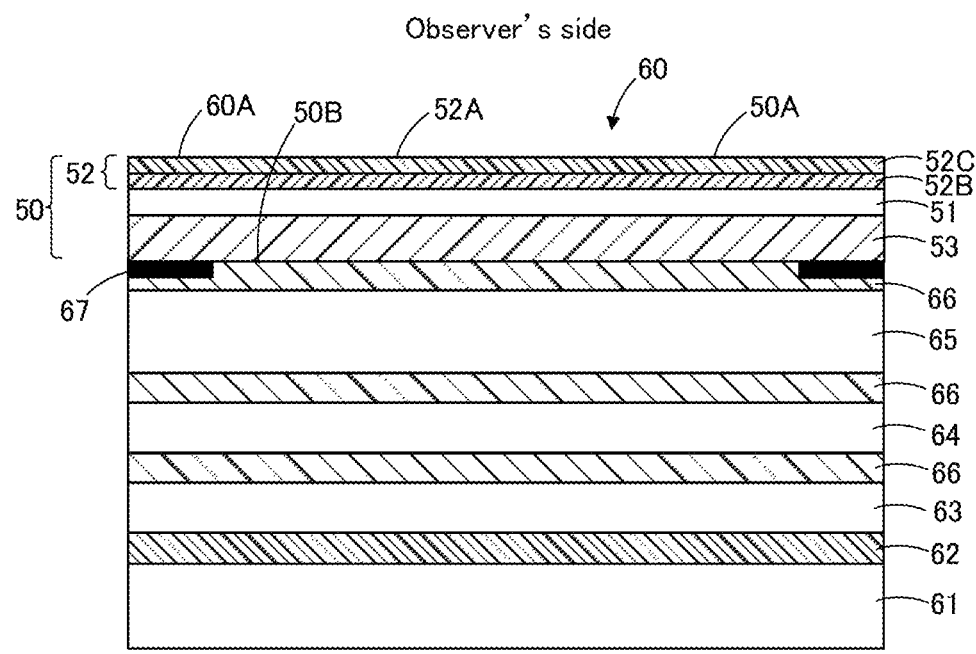
FIG. 5 depicts the schematic diagram of an image display device according to the second embodiment.

The optical film 50 may be incorporated into a foldable image display device and then used. FIG. 5 depicts the schematic diagram of the image display device according to the present embodiment. As shown in FIG. 5, a housing 61 for accommodating a battery and the like, a protective film 62, a display panel 63, a touch sensor 64, a circularly polarizing plate 65, and the optical film 50 are generally laminated in this order toward the observer in the image display device 60. A light-transmitting adhesive 66 is placed between the display panel 63 and the touch sensor 64, between the touch sensor 64 and the circularly polarizing plate 65, and between the circularly polarizing plate 65 and the optical film 50, and these members are anchored to each other with the light-transmitting adhesive 66. Additionally, a black layer 67 is provided on a portion of the back surface 50B of the optical film 50.

In the optical film 50, the hard coat layer 52 is located on the observer's side of the resin base material 51. For the image display device 60, the surface 52A of the hard coat layer 52 (the surface of the second hard coat layer 52C) in the optical film 50 is configured to be the surface 60A of the image display device 60.

As the light-transmitting adhesive 66, for example, an OCA (optical clear adhesive) can be used, and an adhesive layer composed of the above-described acryl-based gel is preferably used in terms of increasing the impact resistance to prevent the damage of the display panel 63. In cases where an adhesive layer composed of the above-described acryl-based gel is used as the light-transmitting adhesive 66, the above-described adhesive layer may be placed between the display panel 63 and the touch sensor 64, between the touch sensor 64 and the circularly polarizing plate 65, and between the circularly polarizing plate 65 and the optical film 50. Additionally, in cases where the resin layer 63 is composed of the above-described acryl-based gel, the circularly polarizing plate 65 can be anchored to the optical film 50 not by placing the light-transmitting adhesive 66 between the circularly polarizing plate 65 and the optical film 50, but by directly laminating the circularly polarizing plate 65 to the resin layer 53, because the above-described acryl-based gel is adhesive.

As described above, the shear loss tangent (tan δ) is conventionally known as an index representing the degree of impact absorbency. Thus, the impact resistance of an optical film configured to comprise a hard coat layer on one surface and a resin layer on the other surface of a resin base material may be expressed by a value of shear loss tangent (tan δ). However, when an impact was applied to the surface of the optical film (the surface of the hard coat layer), it failed to inhibit both depression on the surface of the optical film and damage to members located interior to the optical film in an image display device on the basis of a value of the shear loss tangent (tan δ). This is considered to be related to the fact that the shear loss tangent (tan δ) is the ratio (G''/G') between the shear loss elastic modulus (G'') and the shear storage elastic modulus (G'). The inventors intensively studied further and consequently found that the balance between the film thickness of the resin layer, the shear storage elastic modulus (G'), and the shear loss elastic modulus (G'') is critical to inhibit both depression on the surface of the optical film and damage to members located interior to the optical film in an image display device when an impact is applied to the surface of the optical film. In the optical film 50 configured to comprise the hard coat layer 52 on the one surface 51A of the resin base material 51 and the resin layer 53 on the other surface 51B according to the present embodiment, the film thickness of the resin layer 53 is as thin as a value of 30 μm or more and less than 200 μm, and the above-described shear storage elastic modulus (G') of the optical film 50 is 1 MPa or more and 200 MPa or less, and the above-described shear loss elastic modulus (G'') of the optical film 50 is 0.1 MPa or more and 100 MPa or less. Thus, the optical film 50 can be folded, as well as can inhibit both depression on the surface 50A of the optical film 50 and damage to members such as the display panel 63 located inside of the image display device 60 when an impact is applied to the surface 50A. Consequently, an excellent impact resistance can be achieved.

EXAMPLES

Now, the present invention will be described in more detail by way of examples. However, the present invention is not limited to those examples. The phrase "a converted value in terms of solids" below means a value determined based on the assumption that the content of solids diluted in a solvent is 100%.

<Preparation of Resin Layer Compositions>

The following components were combined to meet the composition requirements indicated below and thereby obtain resin layer compositions.

(Resin Layer Composition 1)
  Urethane acrylate (product name "UV3310B"; manufactured by The Nippon Synthetic Chemical Industry Co., Ltd.; bifunctional): 90 parts by mass;
  Phenoxyethylacrylate (product name "Viscoat #192"; manufactured by Osaka Organic Chemical Industry Ltd.): 10 parts by mass;
  Polymerization initiator (1-hydroxycyclohexyl phenyl ketone; product name "Irgacure®184"; manufactured by BASF Japan Ltd.): 5 parts by mass;
  Methyl isobutyl ketone: 10 parts by mass.

(Resin Layer Composition 2)
  Urethane acrylate (product name "UA-160TM"; manufactured by Shin-Nakamura Chemical Co., Ltd.): 90 parts by mass;
  Phenoxyethylacrylate (product name "Viscoat #192"; manufactured by Osaka Organic Chemical Industry Ltd.): 10 parts by mass;
  Polymerization initiator (1-hydroxycyclohexyl phenyl ketone; product name "Irgacure®184"; manufactured by BASF Japan Ltd.): 5 parts by mass;
  Methyl isobutyl ketone: 10 parts by mass.

(Resin layer composition 3)
  Urethane acrylate (product name "UV2000B"; manufactured by The Nippon Synthetic Chemical Industry Co., Ltd.; bifunctional): 50 parts by mass;
  Phenoxyethylacrylate (product name "Viscoat #192"; manufactured by Osaka Organic Chemical Industry Ltd.): 50 parts by mass;
  Polymerization initiator (1-hydroxycyclohexyl phenyl ketone; product name "Irgacure®184"; manufactured by BASF Japan Ltd.): 5 parts by mass;
  Methyl isobutyl ketone: 10 parts by mass.

<Preparation of Hard Coat Layer Compositions>

The following components were combined to meet the composition requirements indicated below and thereby obtain hard coat layer compositions.

(Hard Coat Layer Composition 1)
  A mixture of dipentaerythritol pentaacrylate and dipentaerythritol hexaacrylate (product name "M403"; manufactured by Toagosei Co., Ltd.): 25 parts by mass;

EO-modified dipentaerythritol hexaacrylate (product name "A-DPH-6E"; manufactured by Shin-Nakamura Chemical Co., Ltd.): 25 parts by mass;

Deformed silica particles (with an average particle diameter of 25 nm; manufactured by JGC C&C): 50 parts by mass (a converted value in terms of solids);

Photopolymerization initiator (1-hydroxycyclohexyl phenyl ketone; product name "Irgacure®184"; manufactured by BASF Japan Ltd.): 4 parts by mass;

Fluorine-based leveling agent (product name "F568"; manufactured by DIC Corporation): 0.2 parts by mass (a converted value in terms of solids);

Methyl isobutyl ketone (MIBK): 150 parts by mass.

(Hard Coat Layer Composition 2)

Urethane acrylate (product name "UX5000"; manufactured by Nippon Kayaku Co., Ltd.): 25 parts by mass;

A mixture of dipentaerythritol pentaacrylate and dipentaerythritol hexaacrylate (product name "M403"; manufactured by Toagosei Co., Ltd.): 50 parts by mass;

Polyfunctional acrylate polymer (product name "Acrit 8KX-012C"; manufactured by Taisei Fine Chemical Co., Ltd.): 25 parts by mass (a converted value in terms of solids);

Antifouling agent (product name "BYK-UV 3500"; manufactured by BYK Japan KK): 1.5 parts by mass (a converted value in terms of solids);

Photopolymerization initiator (1-hydroxycyclohexyl phenyl ketone; product name "Irgacure®184"; manufactured by BASF Japan Ltd.): 4 parts by mass;

Methyl isobutyl ketone (MIBK): 150 parts by mass.

Example A1

A 30-μm-thick polyimide base material having the polyimide backbone represented by the above-described formula (4) was prepared as a resin base material, and the resin layer composition 1 was applied on one surface of the polyimide base material by a bar coater to form a coating film. Then, the resulting coating film was heated at 70° C. for 1 minute to evaporate the solvent in the coating film, and was then exposed to ultraviolet light to a cumulative light dose of 1200 mJ/cm$^2$ in the air with an ultraviolet irradiation device (with an H bulb as a light source; manufactured by Fusion UV Systems Inc.) to cure the coating film, and a resin layer having a film thickness of 200 μm and composed of the urethane resin was thereby formed. Consequently, an optical film comprising the resin layer provided on the polyimide base material was obtained. The thickness of the polyimide base material was determined as the arithmetic mean of the thicknesses at 10 different locations on the polyimide base material measured using a thickness measurement device (product name "Digimatic Indicator IDF-130"; manufactured by Mitutoyo Corporation). Additionally, a cross-section of the resin layer integrated with the polyimide base material was photographed using a scanning electron microscope (SEM) and the film thickness of the resin layer was measured at 20 different locations within the image of the cross-section, and the arithmetic mean of the film thicknesses at the 20 different locations was determined as the film thickness of the resin layer. Also in Examples A2 to A8 and Comparative Examples A1 and A2, the thickness of a base material and the film thickness of a resin layer were measured in the same manner as in Example A1.

Example A2

In Example A2, an optical film was obtained in the same manner as in Example A1, except that the film thickness of the resin layer was 90 μm.

Example A3

In Example A3, an optical film was obtained in the same manner as in Example A1, except that the film thickness of the resin layer was 150 μm.

Example A4

In Example A4, an optical film was obtained in the same manner as in Example A1, except that a 30-μm-thick aramid base material having the aramid backbone represented by the above-described formula (22) was used instead of the polyimide base material.

Example A5

In Example A5, an optical film was obtained in the same manner as in Example A1, except that the resin layer composition 2 was used instead of the resin layer composition 1.

Example A6

In Example A6, an optical film was obtained in the same manner as in Example A1, except that the resin layer composition 3 was used instead of the resin layer composition 1.

Example A7

In Example A7, an optical film was obtained in the same manner as in Example A1, except that a resin layer (product name "May Clean Gel"; manufactured by KGK Chemical Corporation) having a film thickness of 200 μm and composed of an acryl-based gel was laminated to the polyimide base material instead of forming a resin layer composed of the urethane resin on the polyimide base material.

Example A8

In Example A8, an optical film was obtained in the same manner as in Example A7, except that a 30-μm-thick aramid base material having the aramid backbone represented by the above-described formula (22) was used instead of the polyimide base material.

Comparative Example A1

In Comparative Example A1, an optical film was obtained in the same manner as in Example A1, except that a resin layer (product name "αGEL®"; manufactured by Taica Corporation) having a film thickness of 200 μm and composed of a silicone-based gel was laminated to the polyimide base material instead of forming a resin layer composed of the urethane resin on the polyimide base material. The resin layer of Comparative Example A1 was obtained by slicing the resin layer having a thickness of 200 μm from a commercially available αGEL product having a film thickness of 1 mm.

Comparative Example A2

In Comparative Example A2, an optical film was obtained in the same manner as in Comparative Example A1, except that a 30-μm-thick aramid base material having the aramid backbone represented by the above-described formula (22) was used instead of the polyimide base material.

<Measurement of G', G", and tan δ>

The shear storage elastic modulus (G'), shear loss elastic modulus (G"), and shear loss tangent (tan δ) of each of the optical films according to Examples A1 to A8 and Comparative Examples A1 and A2 were measured. Specifically, rectangular pieces of 100 mm×50 mm were first stamped out from the optical film to obtain samples. Each of the two samples was mounted to a measuring tool for a dynamic viscoelasticity measuring device (product name "Rheogel-E4000"; manufactured by UBM Corporation). Specifically, the measuring tool comprised three plates (one inner metal plate with a thickness of 1 mm and two outer metal plates sandwiching the inner plate) arranged in the horizontal direction. One of the samples was held between the inner plate and one outer plate, while the other sample was held between the inner plate and the other outer plate. In this case, each sample was clamped by the inner and outer plates respectively attached to the resin layer and the base material. The samples in the measuring tool with distance between chucks of 20 mm were set in the dynamic viscoelasticity measuring device (product name "Rheogel-E4000"; manufactured by UBM Corporation) and heated at a temperature rising rate of 2° C./min to a predetermined temperature of 25° C. Under this condition, a vertical oscillation with a strain amount of 1% and with a frequency ranging from 500 Hz to 1000 Hz was applied to the two outer plates with keeping the inner plate fixed to perform the dynamic viscoelasticity measurement of solid material at 25° C., whereby the shear storage elastic modulus (G'), shear loss elastic modulus (G"), and shear loss tangent (tan δ) of the optical film were measured. The shear storage elastic modulus (G'), shear loss elastic modulus (G"), and shear loss tangent (tan δ) of the optical film in the frequency range from 500 Hz to 1000 Hz inclusive here were calculated by applying the vertical oscillation with frequencies of 500, 750, and 950 Hz to the outer plates to measure the shear storage elastic modulus (G'), shear loss elastic modulus (G"), and shear loss tangent (tan δ) of the optical film at the respective frequencies; calculating the arithmetic means of these measured shear storage elastic modulus (G'), shear loss elastic modulus (G"), and shear loss tangent (tan δ); and repeating the same measurement three times and further arithmetically averaging the arithmetic means obtained from the three experiments.

<Impact Resistance Test>

Each of the optical films according to Examples A1 to A8 and Comparative Examples A1 and A2 was placed on a soda-lime glass having a thickness of 0.7 mm in such a manner that the soda-lime glass was attached to the base material, and tested three times by dropping a 100 g iron ball with a diameter of 30 mm from 30 cm above the surface of the resin layer of the optical film. The position of dropping the iron ball was changed every time. Then, each optical film was visually evaluated for the presence of any depression on the surface of the resin layer and the presence of any crack in the soda-lime glass. The evaluation results were based on the following evaluation criteria.

(Evaluation of a Depression on the Surface of a Resin Layer)

⊙: no depression was identified on the surface of a resin layer in both cases where the resin layer was observed from front and oblique directions;

○: no depression was identified on the surface of a resin layer in a case where the resin layer was observed from a front direction, while a depression causing no problem in practical use was identified on the surface of the resin layer in a case where the resin layer was observed from an oblique direction;

x: an obvious depression was identified on the surface of a resin layer in both cases where the resin layer was observed from front and oblique directions.

(Evaluation of a Crack in a Soda-Lime Glass)

⊙: no crack was formed in a soda-lime glass;

○: there was no crack but a scratch formed in a soda-lime glass;

Δ: the formation of crack in a soda-lime glass was observed in one or two times;

x: the formation of crack in a soda-lime glass was observed in all the three times.

<Foldability Test>

A rectangular piece of 30 mm×100 mm was cut from each of the optical films according to Examples A1 to A8 and Comparative Examples A1 and A2 to prepare samples, and each of the samples having the short edges (30 mm) fixed with fixing members was mounted to an endurance testing machine (product name "DLDMLH-FS"; manufactured by Yuasa System Co., Ltd.) in such a manner that the minimum distance between the two opposing edges was 3 mm (the outer width of the bent part: 3.0 mm), as shown in FIG. 2(C), and the sample with the resin layer facing inward was folded at an angle of 180 degrees and then unfolded (a foldability test performed on the sample with the resin layer facing inward and the base material facing outward), and the process was repeated one hundred thousand times to examine whether any crack or break was formed at the bent part. Additionally, new samples were produced in the same manner as described above from each of the optical films according to Examples A1 to A8 and Comparative Examples A1 and A2, and each of the samples was mounted in the same manner as described above to the above-described endurance testing machine, and the sample with the base material facing inward was folded at an angle of 180 degrees and then unfolded (a foldability test performed on the sample with the resin layer facing outward and the base material facing inward), and the process was repeated one hundred thousand times to examine whether any crack or break was formed at the bent part. The results of the foldability tests were evaluated based on the following evaluation criteria.

○: no crack or break was formed at the bent part in both of the foldability tests;

x: the formation of crack or break was observed at the bent part in either of the foldability tests.

<Pencil Hardness>

The pencil hardness of the surface of each of the optical films according to Examples A1 to A8 and Comparative Examples A1 and A2 (the surface of each resin layer) was measured based on JIS K5600-5-4: 1999. In the pencil hardness test, a load of 1 kg was applied to a pencil and the pencil was moved at a speed of 1 mm/sec. The grade of the hardest pencil that does not scratch the surface of the optical film during the pencil hardness test is determined as the pencil hardness of the optical film. A plural number of pencils with different hardness were used for the measurement of pencil hardness and the pencil hardness test was repeated five times on each pencil. In cases where no scratch was visibly detected on the surface of the optical plate in four or more out of the five replicates when the surface of the optical film was observed under transmitting fluorescent light, the pencil with the hardness was determined to make no scratch on the surface of the optical film.

The results are shown in Table 1 below.

TABLE 1

|  | Shear storage elastic modulus (G') (MPa) | Shear loss elastic modulus (G") (MPa) | Shear loss tangent (tanδ) | Impact resistance | | Foldability | Pencil hardness |
|  |  |  |  | Depression on the surface of a resin layer | Crack in a soda-lime glass |  |  |
| --- | --- | --- | --- | --- | --- | --- | --- |
| Example A1 | 12.3 | 3.4 | 0.3 | ⊙ | ⊙ | ○ | 5H |
| Example A2 | 12.3 | 3.4 | 0.3 | ⊙ | ⊙ | ○ | 3H |
| Example A3 | 12.3 | 3.4 | 0.3 | ⊙ | ⊙ | ○ | 4H |
| Example A4 | 9.3 | 3.7 | 0.4 | ⊙ | ⊙ | ○ | 5H |
| Example A5 | 1.8 | 0.4 | 0.2 | ⊙ | ⊙ | ○ | 5H |
| Example A6 | 130.0 | 22.3 | 0.2 | ⊙ | ⊙ | ○ | 5H |
| Example A7 | 1.37 | 0.85 | 0.6 | ○ | ○ | ○ | 5B |
| Example A8 | 2.00 | 1.30 | 0.7 | ○ | ○ | ○ | 5B |
| Comparative Example A1 | 0.19 | 0.06 | 0.3 | x | x | x | 6B |
| Comparative Example A2 | 0.20 | 0.07 | 0.4 | x | x | x | 6B |

The results will be described below. The optical films according to Comparative Examples A1 and A2 each have a poor balance between the shear storage elastic modulus (G') and the shear loss elastic modulus (G"), and indicated a greater depth of depression on the surface of the resin layer and also showed the formation of crack in the soda-lime glass. On the contrary, the optical films according to Examples A1 to A8 each have an excellent balance between the shear storage elastic modulus (G') and the shear loss elastic modulus (G"), and showed no depression or a small depression causing no problem in practical use on the surface of the resin layer and also showed no crack in the soda-lime glass.

Additionally, the optical films according to Examples A1 to A8 achieved good results in the foldability test and, moreover, the optical films according to Examples A1 to A6 also showed higher pencil hardness values.

To the surface of the resin layer of the optical film according to Example A1 (hereinafter referred to as "first resin layer"), a second resin layer with a hither pencil hardness value than the first resin layer and a third resin layer with a higher pencil hardness than the first and second resin layers were laminated in this order to produce an optical film. In the optical film, the surface (the surface of the third resin layer) was scratched 10 times with steel wool with a grade of #0000 (product name "Bonstar"; manufactured by Nihon Steel Wool Co., Ltd.) while a load of 1 kg/cm$^2$ was applied, and the resulting surface of the optical film showed no scratch when visually examined for the presence of any scratch.

Example B1

A 30-μm-thick polyimide base material having the polyimide backbone represented by the above-described formula (4) was prepared as a resin base material, and the hard coat layer composition 1 was applied on one surface of the polyimide base material by a bar coater to form a coating film. Then, the resulting coating film was heated at 70° C. for 1 minute to evaporate the solvent in the coating film, and was then exposed to ultraviolet light to a cumulative light dose of 100 mJ/cm$^2$ in the air with an ultraviolet irradiation device (with an H bulb as a light source; manufactured by Fusion UV Systems Inc.) to obtain a semi-cured (half cured) coating film. Next, the hard coat layer composition 2 was applied on the surface of the semi-cured coating film of the coat layer composition 1 by a bar coater to form a coating film. The formed coating film was heated at 70° C. for 1 minute to evaporate the solvent in the coating film, and was then exposed to ultraviolet light to a cumulative light dose of 200 mJ/cm$^2$ under an oxygen concentration of 200 ppm or lower with an ultraviolet irradiation device (with an H bulb as a light source; manufactured by Fusion UV Systems Inc.) to obtain completely cured (full-cured) coating films. Thus, a hard coat layer comprising a first hard coat layer having a film thickness of 10 μm on the polyimide base material and a second hard coat layer having a film thickness of 5 μm laminated to the first hard coat layer was formed. After the hard coat layer was formed on the polyimide base material, a resin layer (product name "May Clean Gel"; manufactured by KGK Chemical Corporation) having a film thickness of 75 μm and composed of an acryl-based gel was laminated to the other surface of the polyimide base material to obtain an optical film. The thickness of the polyimide base material was determined as the arithmetic mean of the thicknesses at 10 different locations on the polyimide base material measured using a thickness measurement device (product name "Digimatic Indicator IDF-130"; manufactured by Mitutoyo Corporation). Additionally, a cross-section of the hard coat layer integrated with the resin layer was photographed using a scanning electron microscope (SEM) and the film thicknesses of the hard coat layer and the resin layer were measured at 20 different locations within the image of the cross-section, and the arithmetic means of the film thicknesses at the 20 different locations were determined as the film thicknesses of the hard coat layer and the resin layer. Also in Examples B2 to B7 and Comparative Examples B1 to B5, the thickness of a base material and the film thicknesses of a hard coat layer and a resin layer were measured in the same manner as in Example B1.

Example B2

In Example B2, an optical film was obtained in the same manner as in Example B1, except that the film thickness of the resin layer was 50 μm.

Example B3

In Example B3, an optical film was obtained in the same manner as in Example B1, except that the film thickness of the resin layer was 180 μm.

Example B4

In Example B4, an optical film was obtained in the same manner as in Example B1, except that a 50-μm-thick polyimide base material was used instead of the 30-μm-thick polyimide base material.

Example B5

In Example B5, an optical film was obtained in the same manner as in Example B1, except that a 30-μm-thick aramid base material having the aramid backbone represented by the above-described formula (22) was used instead of the polyimide base material.

Example B6

In Example B6, an optical film was obtained in the same manner as in Example B1, except that a resin layer composed of a urethane resin was formed instead of the resin layer composed of the acryl-based gel. The resin layer composed of the urethane resin was formed as follows. First, the resin layer composition 1 was applied by a bar coater on a surface of the polyimide base material, which was opposite to the surface where the hard coat layer was formed, to form a coating film. Then, the formed coating film was heated at 70° C. for 1 minute to evaporate the solvent in the coating film, and was then exposed to ultraviolet light to a cumulative light dose of 1200 mJ/cm$^2$ in the air with an ultraviolet irradiation device (with an H bulb as a light source; manufactured by Fusion UV Systems Inc.) to cure the coating film, and a resin layer having a film thickness of 75 μm and composed of the urethane resin was consequently formed.

Example B7

In Example B7, an optical film was obtained in the same manner as in Example B6, except that the film thickness of the resin layer was 180 μm.

Comparative Example B1

In Comparative Example B1, an optical film was obtained in the same manner as in Example B1, except that the film thickness of the resin layer was 200 μm.

Comparative Example B2

In Comparative Example B2, an optical film was obtained in the same manner as in Example B1, except that the film thickness of the resin layer was 25 μm.

Comparative Example B3

In Comparative Example B3, an optical film was obtained in the same manner as in Example B1, except that a resin layer (product name "αGEL®"; manufactured by Taica Corporation) having a film thickness of 75 μm and composed of a silicone-based gel was laminated to the polyimide base material instead of laminating the resin layer composed of the acryl-based gel. The resin layer of Comparative Example B3 was obtained by slicing the resin layer having a thickness of 75 μm from a commercially available αGEL product having a film thickness of 1 mm.

Comparative Example B4

In Comparative Example B4, an optical film was obtained in the same manner as in Example B1, except that a resin layer (product name "αGEL®"; manufactured by Taica Corporation) having a film thickness of 50 μm and composed of a silicone-based gel was laminated to the polyimide base material instead of laminating the resin layer composed of the acryl-based gel. The resin layer of Comparative Example B4 was obtained by slicing the resin layer having a thickness of 50 μm from a commercially available αGEL product having a film thickness of 1 mm.

Comparative Example B5

In Comparative Example B5, an optical film was obtained in the same manner as in Example B1, except that a resin layer (product name "αGEL®"; manufactured by Taica Corporation) having a film thickness of 200 μm and composed of a silicone-based gel was laminated to the polyimide base material instead of laminating the resin layer composed of the acryl-based gel. The resin layer of Comparative Example B5 was obtained by slicing the resin layer having a thickness of 200 μm from a commercially available αGEL product having a film thickness of 1 mm.

<Measurement of G', G'', and tan δ>

The shear storage elastic modulus (G'), shear loss modulus elastic (G''), and shear loss tangent (tan δ) of each of the optical films according to Examples B1 to B7 and Comparative Examples B1 to B5 were measured. Specifically, rectangular pieces of 100 mm×50 mm were first stamped out from the optical film to obtain samples. Each of the two samples was mounted to a measuring tool for a dynamic viscoelasticity measuring device (product name "Rheogel-E4000"; manufactured by UBM Corporation). Specifically, the measuring tool comprised three plates (one inner metal plate with a thickness of 1 mm and two outer metal plates sandwiching the inner plate) arranged in the horizontal direction. One of the samples was held between the inner plate and one outer plate, while the other sample was held between the inner plate and the other outer plate. In this case, each sample was clamped by the inner and outer plates attached to the resin layer and the hard coat layer, respectively. The samples in the measuring tool with distance between chucks of 20 mm were set in the dynamic viscoelasticity measuring device (product name "Rheogel-E4000"; manufactured by UBM Corporation) and heated at a temperature rising rate of 2° C./min to a predetermined temperature of 25° C. Under this condition, a vertical oscillation with a strain amount of 1% and with a frequency ranging from 500 Hz to 1000 Hz was applied to the two outer plates with keeping the inner plate fixed to perform the dynamic viscoelasticity measuring device of solid material at 25° C., whereby the shear storage elastic modulus (G'), shear loss elastic modulus (G''), and shear loss tangent (tan δ) of the optical film were measured. The shear storage elastic modulus (G'), shear loss elastic modulus (G''), and shear loss tangent (tan δ) of the optical film in the frequency range from 500 Hz to 1000 Hz inclusive here were calculated by applying the vertical oscillation with frequencies of 500, 750, and 950 Hz to the outer plates to measure the shear storage elastic modulus (G'), shear loss elastic modulus (G''), and shear loss tangent (tan δ) of the optical film at the respective frequencies; calculating the arithmetic means of these measured shear storage elastic modulus (G'), shear loss modulus elastic (G''), and shear loss tangent (tan δ); and repeating the same measurement three times and further arithmetically averaging the arithmetic means obtained from the three experiments.

<Impact Resistance Test>

Each of the optical films according to Examples B1 to B7 and Comparative Examples B1 to B5 was placed on a soda-lime glass having a thickness of 0.7 mm in such a manner that the soda-lime glass was attached to the resin layer, and tested three times by dropping a 100 g iron ball with a diameter of 30 mm from 30 cm above the surface of the hard coat layer of the optical film. The position of dropping the iron ball was changed every time. Then, each optical film was visually evaluated for the presence of any depression on the surface of the hard coat layer and the presence of any crack in the soda-lime glass. The evaluation results were based on the following evaluation criteria.

(Evaluation of a Depression on the Surface of a Hard Coat Layer)

○: no depression was identified on the surface of a hard coat layer in both cases where the hard coat layer was observed from front and oblique directions;

Δ: no depression was identified on the surface of a hard coat layer in a case where the hard coat layer was observed from a front direction, while a depression was identified on the surface of the hard coat layer in a case where the hard coat layer was observed in an oblique direction;

x: an obvious depression was identified on the surface of a hard coat layer in both cases where the hard coat layer was observed from front and oblique directions.

(Evaluation of a Crack in a Soda-Lime Glass)

⊙: no crack was formed in a soda-lime glass;

○: there was no crack but a scratch formed in a soda-lime glass;

Δ: the formation of crack in a soda-lime glass was observed in one or two times;

x: the formation of crack in a soda-lime glass was observed in all the three times.

<Foldability Test>

A rectangular piece of 30 mm×100 mm was cut from each of the optical films according to Examples B1 to B7 and Comparative Examples B1 to B5 to obtain samples, and each of the samples having the short edges (30 mm) fixed with fixing members was mounted to an endurance testing machine (product name "DLDMLH-FS"; manufactured by Yuasa System Co., Ltd.) in such a manner that the minimum distance between the two opposing edges was 3 mm (the outer width of the bent part: 3.0 mm), as shown in FIG. 2(C), and the sample with the hard coat layer facing inward was folded at an angle of 180 degrees and then unfolded (a foldability test performed on the sample with the hard coat layer facing inward and the resin layer facing outward), and the process was repeated one hundred thousand times to examine whether any crack or break was formed at the bent part. Additionally, new samples were produced in the same manner as described above from each of the optical films according to Examples and Comparative Examples, and each of the samples was mounted in the same manner as described above to the above-described endurance testing machine, and the sample with the resin facing inward was folded at an angle of 180 degrees and then unfolded (a foldability test performed on the sample with the hard coat layer facing outward and the resin layer facing inward), and the process was repeated one hundred thousand times to examine whether any crack or break was formed at the bent part. The results of the foldability tests were evaluated based on the following evaluation criteria.

○: no crack or break was formed at the bent part in both of the foldability tests;

x: the formation of crack or break was observed at the bent part in either of the foldability tests.

The results are shown in Table 2 below.

TABLE 2

| | Film thickness of a resin layer (μm) | Shear storage elastic modulus (G') (MPa) | Shear loss elastic modulus (G") (MPa) | Shear loss tangent (tanδ) | Impact resistance | | Foldability |
|---|---|---|---|---|---|---|---|
| | | | | | Depression on the surface of a hard coat layer | Crack in a soda-lime glass | |
| Example B1 | 75 | 1.37 | 0.85 | 0.6 | ○ | ⊙ | ○ |
| Example B2 | 50 | 1.37 | 0.85 | 0.6 | ○ | ⊙ | ○ |
| Example B3 | 180 | 1.37 | 0.85 | 0.6 | ○ | ○ | ○ |
| Example B4 | 75 | 1.37 | 0.85 | 0.6 | ○ | ⊙ | ○ |
| Example B5 | 75 | 9.3 | 3.7 | 0.4 | ○ | ⊙ | ○ |
| Example B6 | 75 | 12.3 | 3.4 | 0.3 | ○ | ⊙ | ○ |
| Example B7 | 180 | 12.3 | 3.4 | 0.3 | ○ | ⊙ | ○ |
| Comparative Example B1 | 200 | 1.37 | 0.85 | 0.6 | x | ○ | ○ |
| Comparative Example B2 | 25 | 1.37 | 0.85 | 0.6 | ○ | Δ | ○ |
| Comparative Example B3 | 75 | 0.19 | 0.06 | 0.3 | x | ○ | x |
| Comparative Example B4 | 50 | 0.19 | 0.06 | 0.3 | Δ | x | x |
| Comparative Example B5 | 200 | 0.19 | 0.06 | 0.3 | x | x | x |

The results will be described below. In the optical film according to Comparative Example B1, the resin layer had an excessively thick film thickness, and the hard coat layer thus indicated a greater depth of depression on the surface. In the optical film according to Comparative Example B2, the resin layer had an excessively thin film thickness, and the soda-lime glass was thus cracked. In the optical film according to Comparative Example B3, the shear storage elastic modulus (G') was excessively small and the hard coat layer thus indicated a greater depth of depression on the surface. In the optical film according to Comparative Example B4, the resin layer had a thin film thickness, and the shear storage modulus (G') was excessively small and the hard coat layer indicated a depression on the surface; additionally, the shear loss elastic modulus (G") was also excessively small and the soda-lime glass was thus cracked due to the inability of the hard coat layer to absorb the impact. In the optical film according to Comparative Example B5, the resin layer had an excessively thick film thickness, and the shear storage elastic modulus (G') was excessively small and the hard coat layer indicated a greater depth of depression on the surface; additionally, the shear loss elastic modulus (G") was also excessively small and the soda-lime glass was thus cracked due to the inability of the hard coat layer to absorb the impact.

On the contrary, the optical films according to Examples B1 to B7 each have an excellent balance between the film thickness of the resin layer, the shear storage elastic modulus (G'), and shear loss elastic modulus (G"), and showed no depression on the surface of the hard coat layer and also showed no crack in the soda-lime glass. Additionally, the optical films according to Examples B1 to B7 achieved good results in the foldability test.

Measurement of Martens hardness in the first and second hard coat layers of each of the optical films according to Examples B1 to B7 indicated a Martens hardness of 830 MPa for the first hard coat layer and a Martens hardness of 500 MPa for the second hard coat layer. The Martens hardness was measured for each measurement sample using a "T1950 TriboIndenter" manufactured by Hysitron, Inc. Specifically, a piece of each optical film with a size of 1 mm×10 mm was cut from the optical film and embedded in an embedding resin to prepare a block, and homogeneous sections having a thickness of 70 nm or more and 100 nm or less and having no openings or the like were sliced from the block according to a commonly used sectioning technique. For the preparation of sections, an "Ultramicrotome EM UC7" (Lica Microsystems GmbH) was used. Then, the block remaining after slicing the sections was used as a measurement sample. Subsequently, in the cross-section of the measurement sample obtained after slicing the above-described sections, a Berkovich indenter (trigonal pyramid) was used as an indenter and was pressed into the hard coat layer to a depth of 500 nm from a side of each block, held at the position for a certain period of time to relax the residual stress, and then unloaded, under the following measurement conditions to measure the maximum load after the relaxation, and the maximum load $P_{max}$ (μN) and the area of the 500 nm deep indentation A (nm²) were used to calculate the Martens hardness from the value of $P_{max}/A$.

(Measurement Conditions)
loading speed: 10 nm/sec;
dwell time: 5 sec;
unloading speed: 10 nm/sec;
measurement temperature: 25° C.

Additionally, the surface of each of the optical films according to Examples B1 to B7 (the surface of the hard coat layer) was scratched 10 times at a speed of 50 mm/sec with steel wool with a grade of #0000 (product name "Bonstar"; manufactured by Nihon Steel Wool Co., Ltd.) while a load of 1 kg/cm² was applied, and the resulting surface of the optical film showed no scratch when visually examined for the presence of any scratch.

LIST OF REFERENCE NUMERALS 10, 50. Optical film
10A, 12A, 50A, 52A. Surface
11, 51. Resin base material
12, 53. Resin layer
30, 60. Image display device
33, 63. Display panel
52. Hard coat layer

The invention claimed is:

1. A foldable light-transmitting optical film for use in an image display device, comprising:
   a resin base material; and
   a resin layer provided on one surface of the resin base material;
   wherein the shear storage elastic modulus (G') of the optical film at 25° C. in the frequency range from 500 Hz to 1000 Hz inclusive is 1 MPa or more and 200 MPa or less; and
   the shear loss elastic modulus (G") of the optical film at 25° C. in the frequency range from 500 Hz to 1000 Hz inclusive is 0.1 MPa or more and 100 MPa or less.

2. A foldable light-transmitting optical film for use in an image display device, comprising:
   a resin base material; and
   a hard coat layer provided on one surface of the resin base material; and
   a resin layer having a film thickness of 30 μm or more and less than 200 μm provided on the other surface of the resin base material, which is opposite to the one surface of the resin base material;
   wherein the hard coat layer contains a resin,
   the shear storage elastic modulus (G') of the optical film at 25° C. in the frequency range from 500 Hz to 1000 Hz inclusive is 1 MPa or more and 200 MPa or less, and
   the shear loss elastic modulus (G") of the optical film at 25° C. in the frequency range from 500 Hz to 1000 Hz inclusive is 0.1 MPa or more and 100 MPa or less.

3. The optical film according to claim 1, wherein no crack or break is formed in the optical film after folding the optical film at an angle of 180 degrees in a manner that leaves a gap of 3 mm between the opposite edges, unfolding the folded optical film, and repeating the process one hundred thousand times.

4. The optical film according to claim 1, wherein the resin base material comprises a polyimide resin, a polyamide resin, or a combination thereof.

5. A foldable image display device, comprising:
   a display panel; and
   the optical film according to claim 1 placed on the observer's side of the display panel;
   wherein the resin layer of the optical film is placed on the observer's side of the resin base material.

6. A foldable image display device, comprising:
   a display panel; and
   the optical film according to claim 2 placed on the observer's side of the display panel;
   wherein the hard coat layer of the optical film is placed on the observer's side of the resin base material.

7. The image display device according to claim 5, wherein the display panel is an organic light-emitting diode panel.

8. The optical film according to claim 2, wherein no crack or break is formed in the optical film after folding the optical film at an angle of 180 degrees in a manner that leaves a gap of 3 mm between the opposite edges, unfolding the folded optical film, and repeating the process one hundred thousand times.

9. The optical film according to claim 2, wherein the resin base material comprises a polyimide resin, a polyamide resin, or a combination thereof.

10. The image display device according to claim 6, wherein the display panel is an organic light-emitting diode panel.

11. The optical film according to claim 1, wherein the resin layer has a film thickness of 50 μm or more and 300 μm or less.

12. The optical film according to claim 1, wherein the resin layer contains one or more resins selected from the group consisting of a urethane-based resin, a urethane-based gel, an acryl-based gel, a silicone-based gel, and an epoxy resin.

13. The optical film according to claim 2, wherein the resin layer contains one or more resins selected from the group consisting of a urethane-based resin, a urethane-based gel, an acryl-based gel, a silicone-based gel, and an epoxy resin.

14. The optical film according to claim 2, wherein the hard coat layer has a film thickness of 1 μm or more 20 μm or less.

\* \* \* \* \*